United States Patent
Singh et al.

(10) Patent No.: US 12,027,581 B2
(45) Date of Patent: *Jul. 2, 2024

(54) SEMICONDUCTOR DEVICE WITH AIR-VOID IN SPACER

(71) Applicant: Taiwan Semiconductor Manufacturing Company, Ltd., Hsinchu (TW)

(72) Inventors: Gulbagh Singh, Tainan (TW); Kun-Tsang Chuang, Miaoli (TW); Hsin-Chi Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/866,772

(22) Filed: Jul. 18, 2022

(65) Prior Publication Data

US 2022/0352307 A1    Nov. 3, 2022

Related U.S. Application Data

(63) Continuation of application No. 16/851,329, filed on Apr. 17, 2020, now Pat. No. 11,404,537.

(51) Int. Cl.
*H01L 29/94*    (2006.01)
*H01L 29/06*    (2006.01)
(Continued)

(52) U.S. Cl.
CPC ...... *H01L 29/0649* (2013.01); *H01L 29/6656* (2013.01); *H01L 29/66825* (2013.01); *H01L 29/788* (2013.01); *H10B 41/35* (2023.02)

(58) Field of Classification Search
CPC ............. H01L 29/0649; H01L 29/6656; H01L 29/66825; H01L 29/788; H01L 29/4991;
(Continued)

(56) References Cited

U.S. PATENT DOCUMENTS 11,404,537 B2 *  8/2022  Singh .................. H01L 29/788
2006/0205169 A1    9/2006  Yoon et al.
(Continued)

FOREIGN PATENT DOCUMENTS

JP    2017-520910 A    7/2017
KR    20180068846 A    6/2018
(Continued)

OTHER PUBLICATIONS

Korean Office Action on KR Appl. Ser. No. 10-2020-0086673 dated Jan. 21, 2022.
(Continued)

*Primary Examiner* — Theresa T Doan

(74) *Attorney, Agent, or Firm* — FOLEY & LARDNER LLP

(57) ABSTRACT

A semiconductor device includes a substrate, a gate oxide layer formed on the substrate, a gate formed on the gate oxide layer, and a spacer formed adjacent the gate and over the substrate. The spacer includes a void filled with air to prevent leakage of charge to and from the gate, thereby reducing data loss and providing better memory retention. The reduction in charge leakage results from reduced parasitic capacitances, fringing capacitances, and overlap capacitances due to the low dielectric constant of air relative to other spacer materials. The spacer can include multiple layers such as oxide and nitride layers. In some embodiments, the semiconductor device is a multiple-time programmable (MTP) memory device.

20 Claims, 26 Drawing Sheets

(51) Int. Cl.
*H01L 29/66* (2006.01)
*H01L 29/76* (2006.01)
*H01L 29/788* (2006.01)
*H10B 41/35* (2023.01)

(58) Field of Classification Search
CPC .......... H01L 29/6653; H01L 29/40114; H01L 29/42328; H01L 29/40117; H01L 21/28141; H01L 21/28518; H01L 21/7682; H01L 29/4983; H10B 41/35; H10B 41/30
USPC ....................................................... 257/314
See application file for complete search history.

(56) References Cited

U.S. PATENT DOCUMENTS

| | | | |
|---|---|---|---|
| 2007/0109872 A1* | 5/2007 | Lin | .................... G11C 16/0475 |
| | | | 257/E29.302 |
| 2007/0122958 A1 | 5/2007 | Fang | |
| 2013/0093019 A1 | 4/2013 | Ando et al. | |
| 2014/0327054 A1 | 11/2014 | Adam et al. | |
| 2015/0016185 A1* | 1/2015 | King Liu | ................ G11C 11/36 |
| | | | 365/175 |
| 2015/0333072 A1 | 11/2015 | Li et al. | |
| 2017/0194423 A1 | 7/2017 | Lin | |
| 2018/0166553 A1 | 6/2018 | Lee et al. | |
| 2018/0204927 A1 | 7/2018 | Chanemougame et al. | |
| 2020/0098886 A1 | 3/2020 | Liu et al. | |
| 2020/0111886 A1 | 4/2020 | Ando et al. | |
| 2020/0388694 A1* | 12/2020 | Cheng | ................. H01L 29/6653 |

FOREIGN PATENT DOCUMENTS

| | | |
|---|---|---|
| KR | 20200035893 A | 4/2020 |
| TW | 201725726 A | 7/2017 |
| TW | 201923897 A | 6/2019 |
| WO | WO-2019/005109 A1 | 1/2019 |

OTHER PUBLICATIONS

Non-Final Office Action on U.S. Appl. No. 16/851,329 dated Dec. 21, 2021.
Notice of Allowance on U.S. Appl. No. 16/851,329 dated Mar. 30, 2022.
Office Action on U.S. Appl. No. 16/851,329 dated Aug. 24, 2021.
Office Action on U.S. Appl. No. 16/851,329 dated May 26, 2021.

* cited by examiner

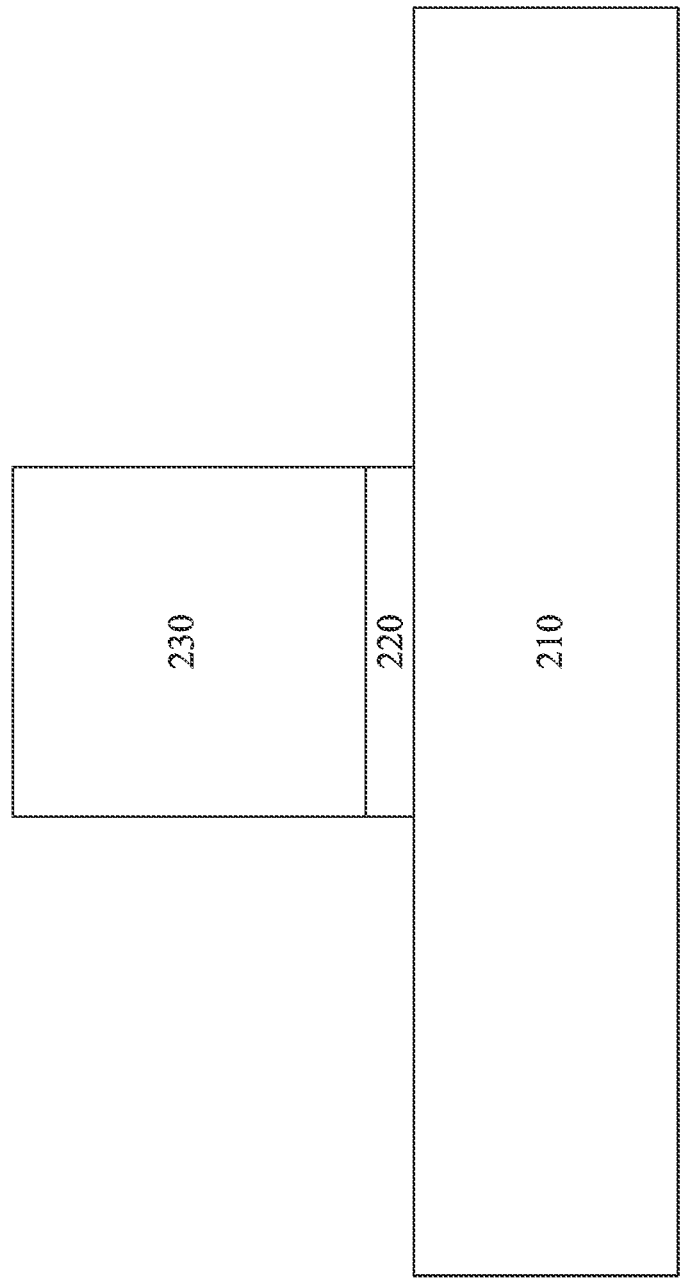

SEMICONDUCTOR DEVICE WITH AIR-VOID IN SPACER

CROSS-REFERENCE TO RELATED APPLICATION

The present application is a Continuation of U.S. application Ser. No. 16/851,329, filed Apr. 17, 2020, the entire content of which is incorporated herein by reference.

BACKGROUND

The present disclosure generally relates to semiconductor devices and methods for fabricating semiconductor devices, and particularly to the formation of multiple-time programmable (MTP) memory devices that have improved data retention.

Semiconductor devices are used in a wide variety of electronics, and improvements regarding both production and performance of semiconductor devices are generally desired. MTP memory devices that utilize high dielectric ("high-k") spacer materials may include high charge trap centers and can form a path for current leakage and reduced data retention. Therefore, there is a need for an improved MTP memory device, and a method of forming the same.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2C-2K are a series of drawings showing the steps in the process of FIG. 2B, in accordance with some embodiments.

DETAILED DESCRIPTION

Figure 1A:
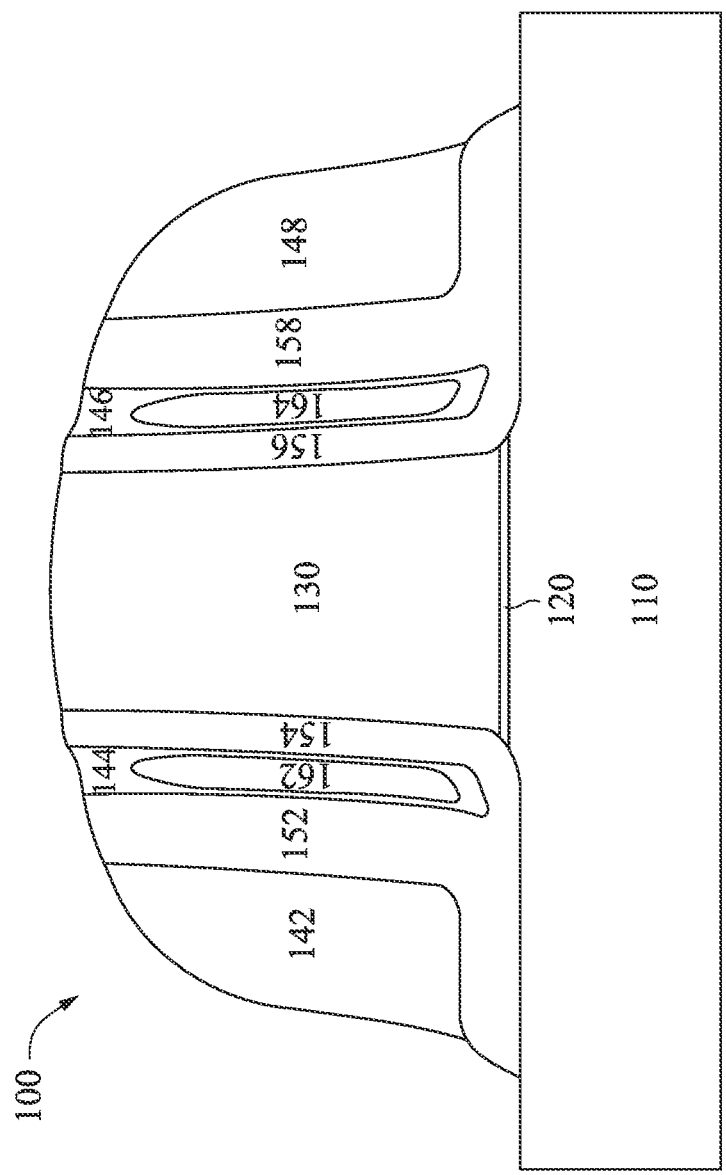
FIG. 1A is a drawing showing a cross-sectional view of an example semiconductor device having a spacer with an air-void, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device that utilize one or more spacers having an air void formed therein, which advantageously results in better isolation and thus better data retention. The air voids may have the effect of providing a lower effective dielectric constant for the spacer. This in turn may advantageously reduce fringing/overlap capacitances and thus also reduce the leakage path between the floating gate and the spacer.

Referring now to FIG. 1A, a semiconductor device 100 having a spacer with an air-voids is shown in accordance with some embodiments. Semiconductor device 100 may generally be a memory device that provides data retention. For example, semiconductor device 100 can provide non-volatile memory such that it retains data even without power. In some embodiments, semiconductor device 100 is a multiple-time programmable (MTP) memory device that allows more than one write operation. Generally, MTP memory cells can include transistors, capacitors, conductors, and other suitable materials and devices. For example, complementary metal-oxide-semiconductor (CMOS) devices, metal-oxide semiconductor field-effect transistors (MOSFET), fin field-effect transistors (FinFET), and silicon-on-insulator (SOI) devices can be used to form MTP memory cells. However, other similar types of materials and devices are also contemplated.

Semiconductor device 100 is shown to include a substrate 110, a gate oxide layer 120, and a gate 130. Substrate 110 can be implemented as an n-type substrate or a p-type substrate. For example, substrate 110 can be formed of silicon material (e.g. crystalline silicon) that is doped with an n-type dopant such as arsenic, phosphorous, and other similar dopants. Substrate 110 can also be doped with p-type dopants such as boron and other similar dopants. Substrate 110 can be implemented using an SOI structure, a silicon-on-sapphire (SOS) structure, a bulk semiconductor structure, an alloy semiconductor, a compound semiconductor, germanium, and various other suitable materials and combinations thereof. Further, both source and drain regions can be formed in substrate 110. In some embodiments, the source and drain regions are formed using ion implantation processes. Any suitable doping materials including both n-type and p-type precursor materials can be used to form the source and drain regions such as phosphorous, phosphine, boron, gallium, indium, and other similar materials. The substrate may further include isolation structures at the outer peripheries to prevent crosstalk between devices.

Gate oxide layer 120 is generally a dielectric layer formed on substrate 110 that separates gate 130 from substrate 110 and the source and drain terminals formed therein. Accordingly, in some embodiments, gate oxide layer 120 is formed between the source and drain terminals formed within substrate 110. Gate oxide layer 120 can be formed on substrate 110 using processes such as thermal oxidation, blanket deposition, patterning, and etching. Gate oxide layer 120 can be formed of a material with a high dielectric constant such as silicon nitride, aluminum oxide, silicon dioxide, and other suitable materials. In some embodiments, gate oxide layer 120 has a dielectric constant of about 3.5 or higher.

As shown in FIG. 1A, gate 130 is formed on gate oxide layer 120. In some embodiments, gate 130 is a floating gate structure that is electrically isolated and formed of polysilicon material. In this sense, gate 130 may only be capacitively connected to other regions of semiconductor device 100 such as the source and drain regions. Gate 130 may also be a metal gate, and can include various structures such as capping layers, etch stop layers, barrier layers, gate dielectric layers, work function layers, fill metal layers, and other suitable materials. Voltage applied at gate 130 can generally control the operation of semiconductor device 100.

Semiconductor device 100 is also shown to include various spacer structures for electrically isolating gate 130. Memory devices can generally suffer from data loss as a result of charge leakage. The design and structure of the overall spacer structure surrounding gate 130 can reduce or prevent charge leakage and can increase overall performance with respect to data retention of semiconductor device 100. Some previous approaches have included a curved gate head that extends above the surrounding spacer structure. This structure can create an imperfect shield, especially on the immediate boundary where the spacer structure contacts the gate. In these approaches, electric charge can leak from the gate to nearby electrodes (e.g. source and drain terminals) and from the nearby electrodes to the gate, through the spacer structure. Use of a gate and/or a spacer structure including materials with high dielectric constants can create a structure with high parasitic capacitances, high fringing capacitances (both inner and outer), and high overlap capacitances. These phenomena can cause charge leakage and data loss.

Semiconductor device 100 is shown to include a spacer structure with four main layers on each side of gate 130. The overall spacer structure is formed adjacent gate 130 and over substrate 110 to prevent charge leakage and improve data retention. On the left side of gate 130 is a spacer layer 154 in contact with gate 130, a spacer layer 144 in contact with spacer layer 154, a spacer layer 152 in contact with spacer layer 144, and a spacer layer 142 in contact with spacer layer 152. On the right side of gate 130 is a spacer layer 156 in contact with gate 130, a spacer layer 146 in contact with spacer layer 156, a spacer layer 158 in contact with spacer layer 146, and a spacer layer 148 in contact with spacer layer 158. Notably, within spacer layer 144 exists a void 162, and within spacer layer 146 exists a void 164. These materials collectively form the overall spacer that is formed adjacent gate 130 and over substrate 110 to prevent charge leakage and improve data retention. Notably, gate 130 has a flat or mostly flat head that is flush or mostly flush with the top surface of the spacer.

In some embodiments, spacer layers 152, 154, 156, and 158 are oxide layers. For example, each of these layers can be formed of silicon oxide material, which has a dielectric constant of about 3.9. In some embodiments, spacer layers 152, 154, 156, and 158 are nitride layers. For example, each of these layers can be formed of silicon nitride material, which has a dielectric constant of about 7.5. These materials collectively provide a so-called "high-k" spacer that has a relatively high dielectric constant. As shown in FIG. 1A, spacer layers 142, 144, 146, and 148 are in contact with the top surface of substrate 110, however spacer layers 142, 144, 146, and 148 are not in contact with the top surface of substrate 110. While oxide and nitride layers are described herein, it will be appreciated that other suitable materials can be used to form a spacer structure to electrically isolate gate 130.

Both void 162 and void 164 are filled with air, which notably has a much lower dielectric constant of about 1.0 when compared with the surrounding spacer materials. As mentioned above and shown in FIG. 1A, void 162 is formed within spacer layer 144 and void 164 is formed within spacer layer 146. In some embodiments, void 162 is completely surrounded by the nitride material of spacer layer 144 and void 164 is completely surrounded by the nitride material of spacer layer 146. In some embodiments, void 162 and void 164 are formed using a wet etching process. Since void 162 and void 164 are filled with air, the overall dielectric constant of the spacer structure is reduced, and therefore the associated fringing capacitances, parasitic capacitances, and overlap capacitances are reduced. These phenomena provide a device structure with better data retention and reduced charge leakage.

Figure 1B:
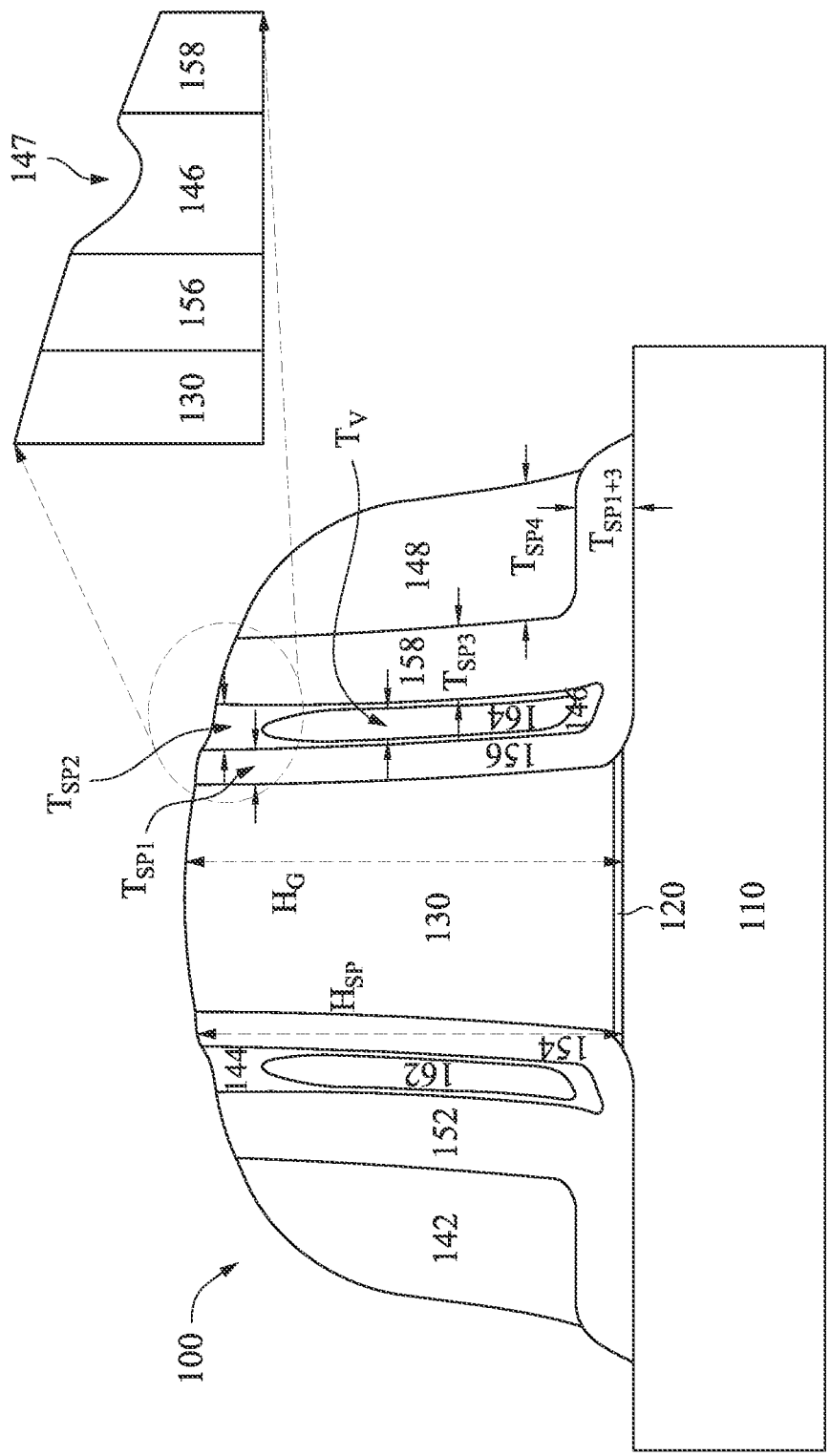
FIG. 1B is a drawing showing various dimensional characteristics of the example semiconductor device of FIG. 1A, in accordance with some embodiments.

Referring now to FIG. 1B, another example semiconductor device 100 is shown, in accordance with some embodiments. FIG. 1B provides an illustration of relevant dimensions associated with semiconductor device 100. The variable $H_G$ represents the height of gate 130, measured vertically from the top surface of substrate 110. The variable $H_{SP}$ represents the height of spacer layer 154, measured vertically from substrate 110. The variable $T_{SP1}$ represents the thickness of spacer layer 156, measured horizontally (i.e. in a direction parallel to the top surface of substrate 110). The variable $T_{SP2}$ represents the thickness of spacer layer 146, measured horizontally and including the thickness of void 162. The variable $T_{SP3}$ represents the thickness of spacer layer 158, measured horizontally. The variable $T_V$ represents the thickness of void 164, measured horizontally. The variable $T_{SP4}$ represents the thickness of spacer layer 148, measured horizontally. The variable $T_{SP1+3}$ represents the thickness of combined material from spacer layers 156 and 158 that resides below the bottom of spacer layers 146 and 148 and above substrate 110, measured vertically from the top surface of substrate 110. It will be appreciated that semiconductor device 100 is symmetric or nearly symmetric in nature, and accordingly the thickness of spacer layer 154 will be the same or nearly the same as the thickness of spacer layer 156 ($T_{SP1}$), for example.

Regarding $H_G$ and $H_{SP}$, in some embodiments, the ratio of $H_{SP}$ to $H_G$ is greater than 0.95. Ensuring that gate 130 has a flat or nearly flat head in this manner relative to the overall spacer structure formed adjacent gate 130 and over substrate 110 can provide an effective structure to reduce charge leakage. Regarding $T_{SP1}$, in some embodiments, this thickness ranges from about 10-150 angstroms, however thicknesses outside of this range are also contemplated. Regarding $T_{SP3}$, in some embodiments, this thickness ranges from about 50-300 angstroms, however thicknesses outside of this range are also contemplated. Accordingly, $T_{SP3}$ is typically greater than $T_{SP1}$, and the ratio of $T_{SP1}$ to $T_{SP3}$ is, in some embodiments, in the range of about 0.025-0.5, however thicknesses outside of this range are also contemplated. Regarding $T_{SP1+3}$, in some embodiments, this thickness is equal to or about equal to the sum of $T_{SP1}$ and $T_{SP3}$ (e.g. within 10% of this sum), however thicknesses outside of this range are also contemplated.

Regarding $T_V$ and the size of void 164 generally, the cross-sectional area of void 164 in some embodiments ranges from 5% to 80% of the cross-sectional area of spacer layer 146, however cross-sectional areas outside of this range are also contemplated. In some embodiments, void 164 is completely surrounded by spacer layer 146 and formed completely within spacer layer 146. However, void 164 can also be formed such that it is only partially surrounded by spacer layer 146 and is in contact with one or more of spacer layer 156, spacer layer 158, and substrate 110. The vertical height of void 164 ranges from 10% to 80% of the height of spacer layer 146 in some embodiments, however heights outside of this range are also contemplated. Similarly, in some embodiments, void 162 is completely surrounded by spacer layer 144 and formed completely within spacer layer 144. However, void 162 can also be formed such that it is only partially surrounded by spacer layer 144 and is in contact with one or more of spacer layer 152, spacer layer 154, and substrate 110. The cross-sectional area of void 162 ranges from 5% to 80% of the cross-sectional area of spacer layer 144 in some embodiments, however cross-sectional areas outside of this range are also contemplated. The vertical height of void 162 ranges from 10% to 80% of the height of spacer layer 144 in some embodiments, however heights outside of this range are also contemplated. The location of void 162 and void 164 within spacer layer 144 and spacer layer 146, respectively, can be adjusted (e.g. closer to substrate 110, closer to gate 230, etc.) depending on the intended application. The ratio of $T_V$ to $T_{SP2}$ ranges from 0.1-1 in some embodiments, however thicknesses outside of this range are also contemplated.

Also shown in FIG. 1B is a zoomed-in view showing a top surface of semiconductor device 100. Specifically, a dip 147 is shown to be formed within the top surface of spacer layer 146. In some embodiments, dip 147 is etched into the top surface of spacer layer 146 as shown to reduce fringing capacitance and prevent charge leakage. A similar dip can be etched into the top surface of spacer layer 144. It will be appreciated that these dimensions are provided as examples and can vary depending on the specific implementation of semiconductor device 100.

Figure 2A:
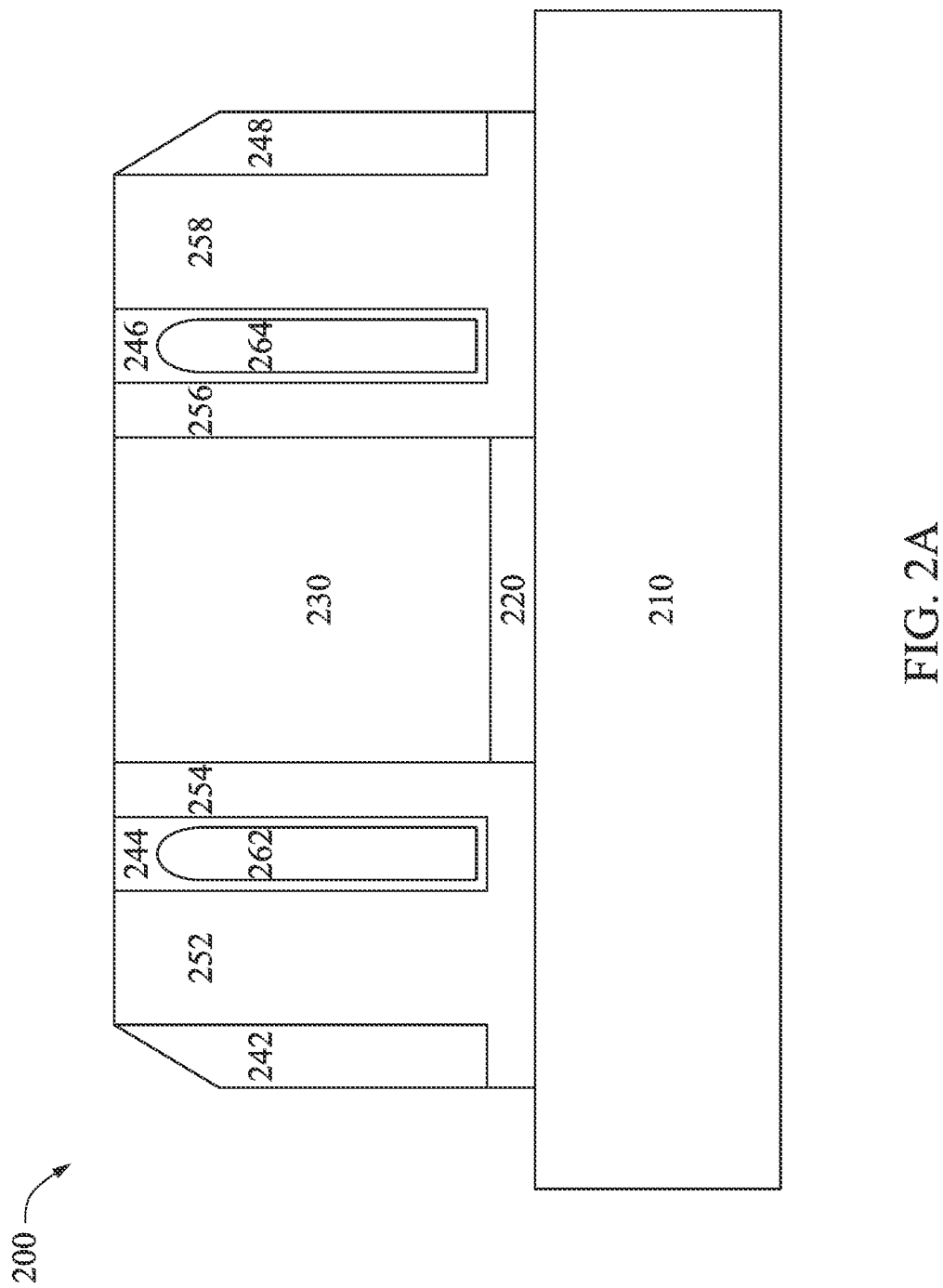
FIG. 2A is a drawing showing a cross-sectional view of another example semiconductor device having a spacer with an air-void, in accordance with some embodiments.

Referring now to FIGS. 2A-2K, an example semiconductor device 200 and an example process 290 for fabricating semiconductor device 200 are shown, in accordance with some embodiments. Semiconductor device 200 is similar to semiconductor device 100 in many aspects. Referring specifically to FIG. 2A, a semiconductor device 200 is shown to include a substrate 210, a gate oxide layer 220, and a gate 230. These structures are similar to substrate 110, gate oxide layer 120, and gate 130 described above. Semiconductor device 200 is also shown to have a spacer structure including, to the left of gate 230, a spacer layer 254, a spacer layer 244, a spacer layer 252, and a spacer layer 242 and, to the right of gate 230, a spacer layer 256, a spacer layer 246, a spacer layer 258, and a spacer layer 248. Spacer layers 242, 244, 246, and 248 are nitride layers, such as formed of silicon nitride material. Spacer layers 252, 254, 256, and 258 are oxide layers, such as formed of silicon oxide material. A void 262 filled with air is formed within spacer layer 244, and a void 264 filled with air is formed within spacer layer 246. These structures are similar to spacer layers 142, 144, 146, 148, 152, 154, 156, and 158 and voids 162 and 164 described above.

Figure 2B:
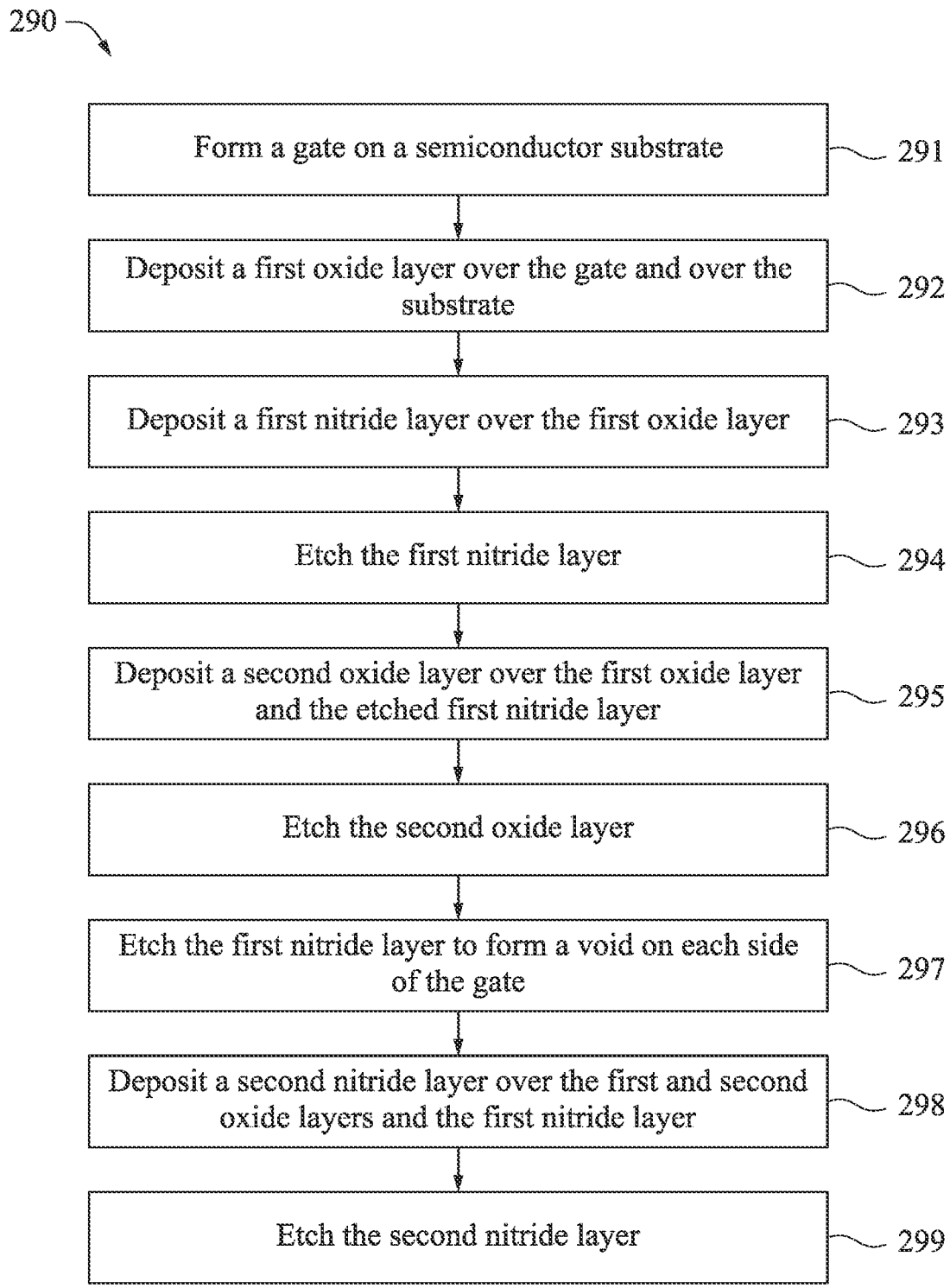
FIG. 2B is a flowchart showing a process for fabricating the example semiconductor device of FIG. 2A, in accordance with some embodiments.

Referring specifically to FIG. 2B, a flowchart illustrating the steps of process 290 is shown. Referring specifically to FIGS. 2C-2K, various drawings illustrating the steps of process 290 are shown. Process 290 provides a method for forming voids in a spacer during formation of the spacer itself. Process 290 provides an example of one possible process for producing a semiconductor device with air-voids in a spacer structure. Further examples are provided below with respect to FIGS. 3A-3K and FIG. 4.

In a step 291, a gate is formed on a semiconductor substrate (FIG. 2C). Step 291 can include forming gate oxide layer 220 on substrate 210 and forming gate 230 on gate oxide layer 220. In some embodiments, gate 230 is formed of polysilicon material and gate oxide layer 220 is a dielectric material separating gate 230 from source and drain terminals formed within substrate 210. Gate oxide layer 220 can be formed using a thermal oxidation process and can range in thickness. In some embodiments, gate 230 is a floating gate that is electrically isolated, for example as part of a floating gate MOSFET or generally a floating-gate transistor. As illustrated, gate oxide layer 220 is formed on substrate 210 and gate 230 is formed on gate oxide layer 220.

Figure 2D:
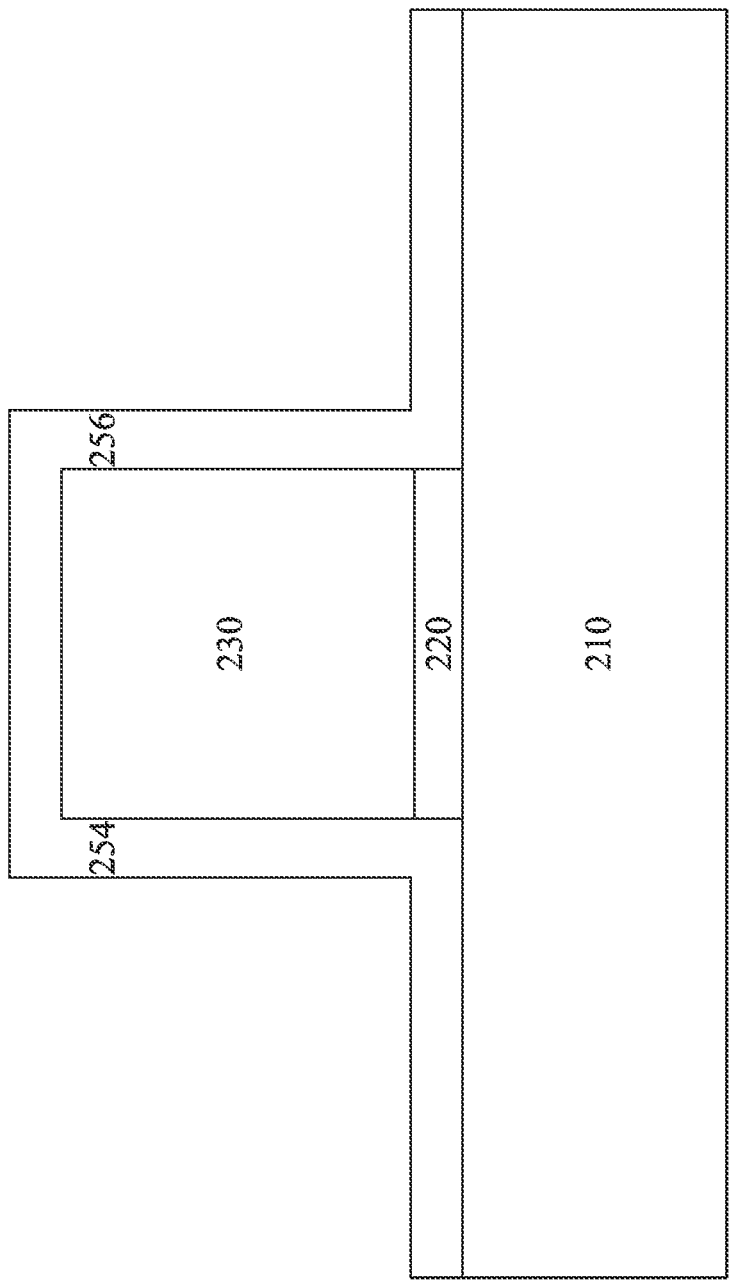

In a step 292, a first oxide layer is deposited over the gate and over the substrate (FIG. 2D). Step 292 can include depositing the oxide layer that forms spacer layers 254 and 256. The first oxide layer is the first layer in contact with gate 230 as part of a larger spacer structure that is designed to electrically isolate gate 230 and to prevent charge leakage. In some embodiments, the first oxide layer deposited in step 292 has a thickness of 80 angstroms. However, the first oxide layer can be slightly thicker or thinner, such as ranging from about 65 to 95 angstroms in thickness. Thicknesses outside of this range are also contemplated depending on the application. The first oxide layer can be formed of silicon oxide or another similar oxide material. As illustrated, the first oxide layer is deposited over gate 230 and over substrate 210.

Figure 2E:
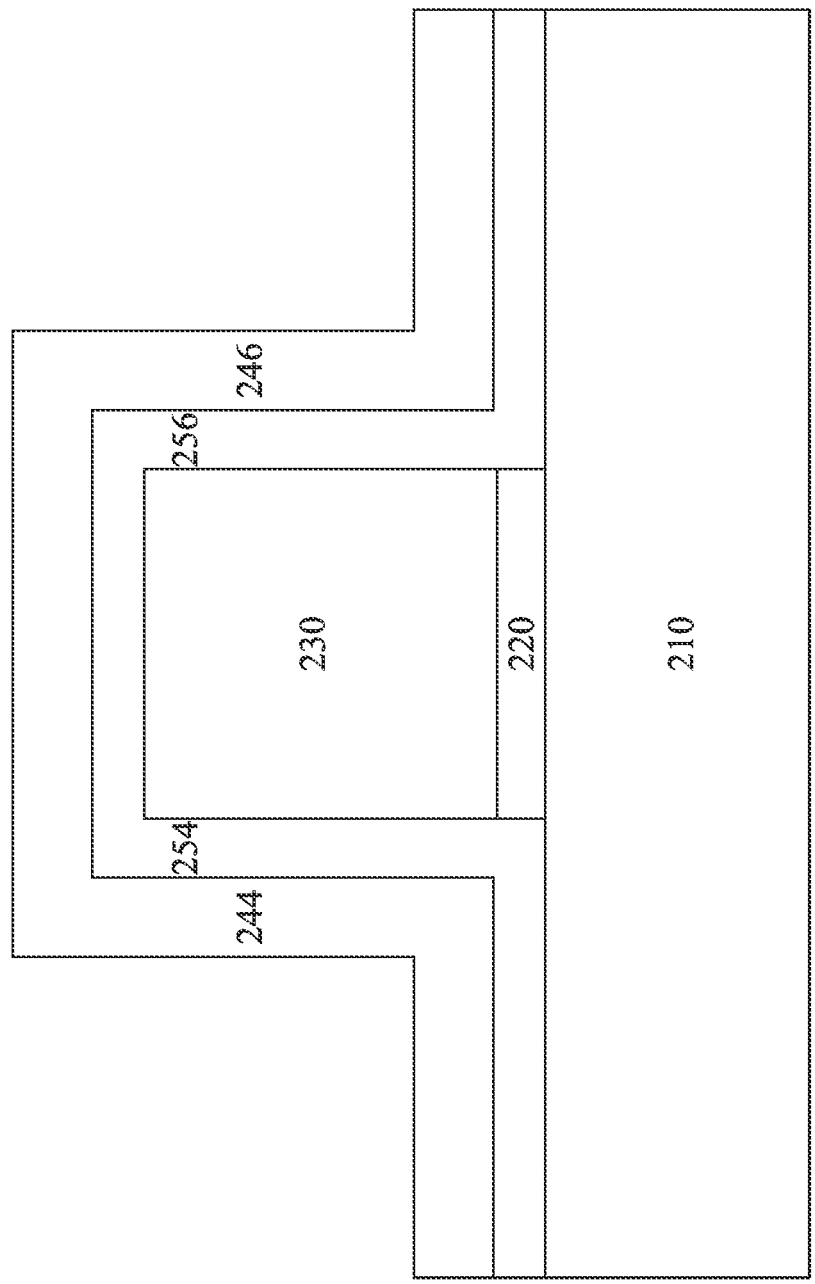

In a step 293, a first nitride layer is deposited over the first oxide layer (FIG. 2E). Step 293 can include depositing the layer of silicon nitride that forms spacer layers 244 and 246. The first nitride layer thus is in contact with the first oxide layer, and forms a second layer of the larger spacer structure that electrically isolates gate 230. In some embodiments, the first nitride layer deposited in step 293 has a thickness of 150 angstroms. However, the first nitride layer can be slightly thicker or thinner, such as ranging from about 120-180 angstroms in thickness. Thicknesses outside of this range are also contemplated depending on the application. The first nitride layer can be formed of silicon nitride or another similar material. As noted above, silicon nitride has a dielectric constant of about 7.5, which is higher than the dielectric constant of silicon oxide. As illustrated, the first nitride layer is deposited over the first oxide layer.

Figure 2F:
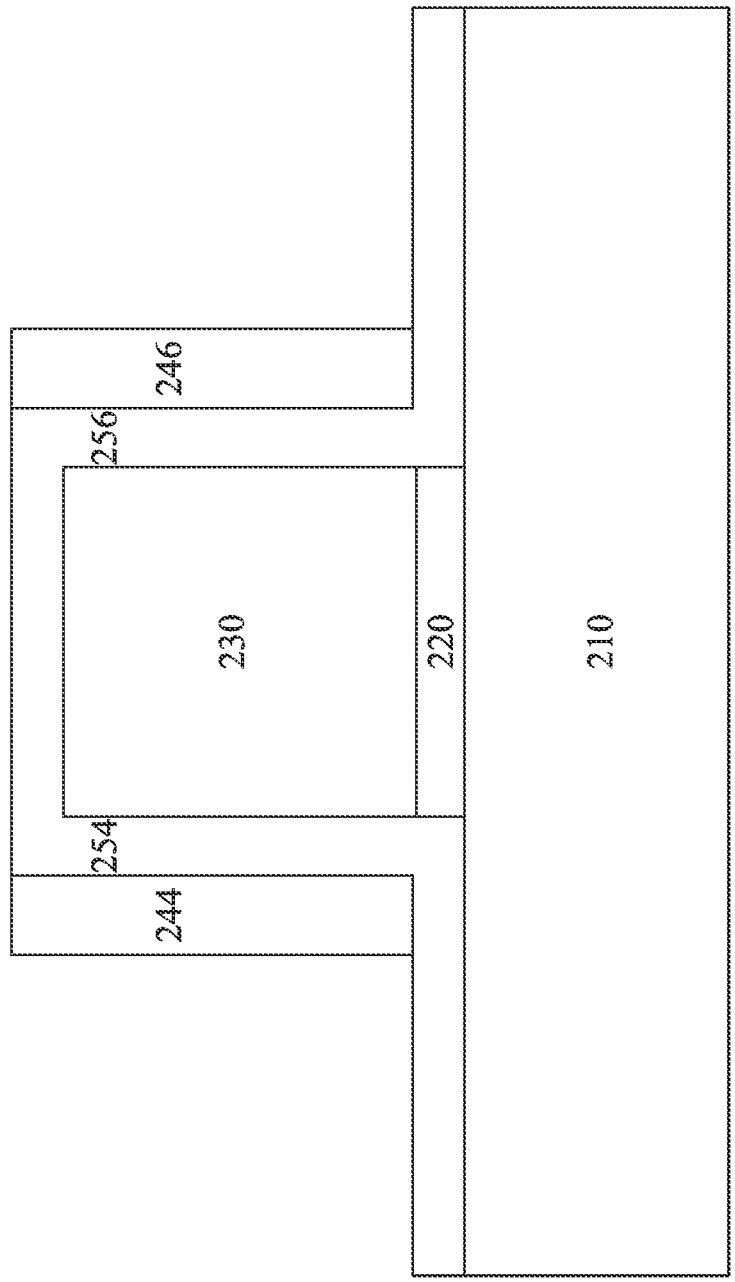

In a step 294, the first nitride layer is etched (FIG. 2F). Step 294 can include shaping the first nitride layer as illustrated in FIG. 2F such that two vertical portions of the first nitride layer remain. As shown, the top surface of these vertical portions are flush or approximately flush with the top surface of the first oxide layer. As a result of the etching process performed in step 294, the thickness of the remaining vertical portions of the first nitride layer is about 120 angstroms, in some embodiments. However, the thickness of these vertical portions may be thicker or thinner, such as ranging from about 100-140 angstroms in thickness. Thicknesses outside of this range are also contemplated depending on the application. In some embodiments, the etching process performed in step 294 is a dry etching process.

Figure 2G:
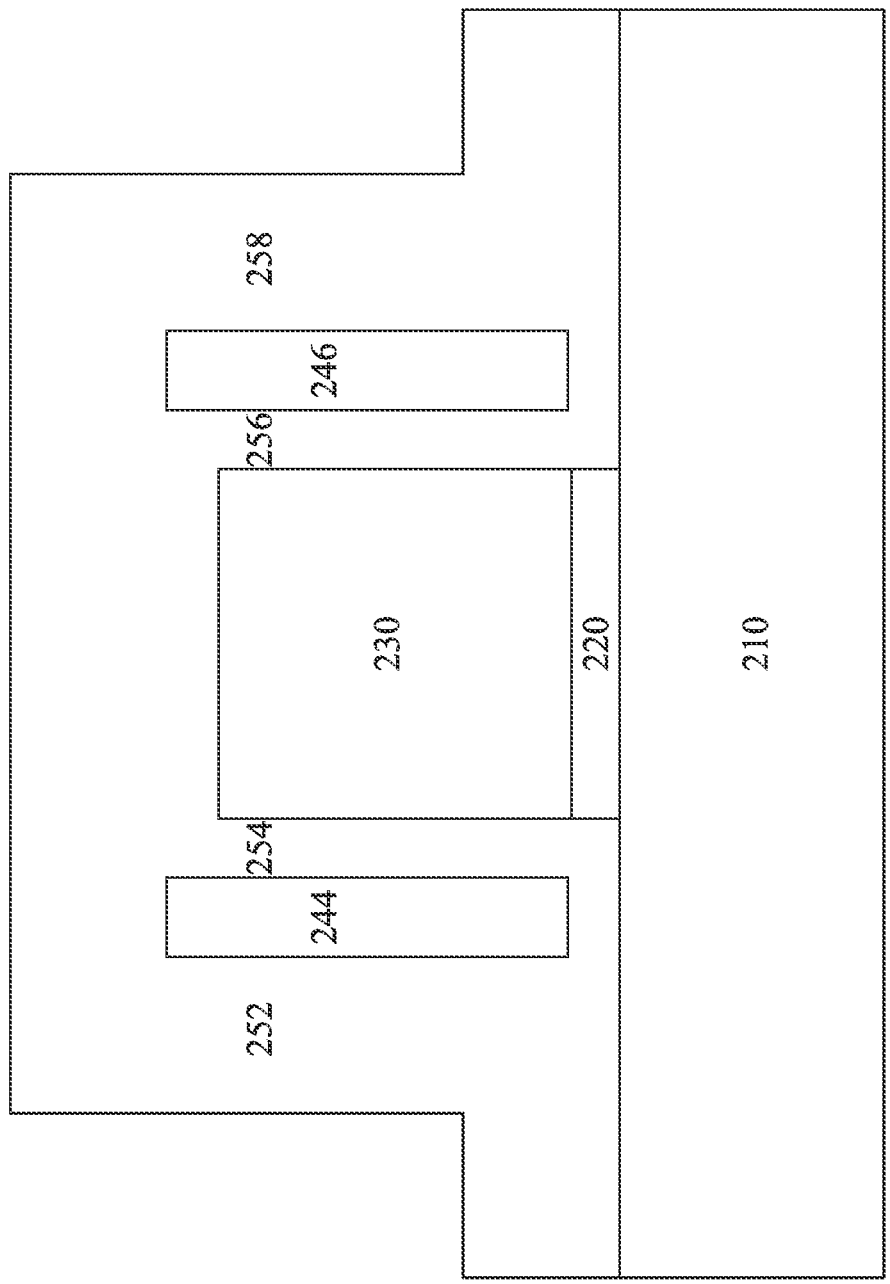

In a step 295, a second oxide layer is deposited over the first oxide layer and the etched first nitride layer (FIG. 2G). Step 295 can include depositing the oxide layer that forms spacer layers 252 and 258. In some embodiments, the second oxide layer deposited in step 295 has a thickness of 500 angstroms. However, the second oxide layer may be slightly thicker or thinner, such as ranging from about 300-700 angstroms. Thicknesses outside of this range are also contemplated depending on the application. Like the first oxide layer, the second oxide layer can be formed of silicon oxide or another similar oxide material. As illustrated in FIG. 2G, the second oxide layer is deposited over the first oxide layer and the etched first nitride layer.

Figure 2H:
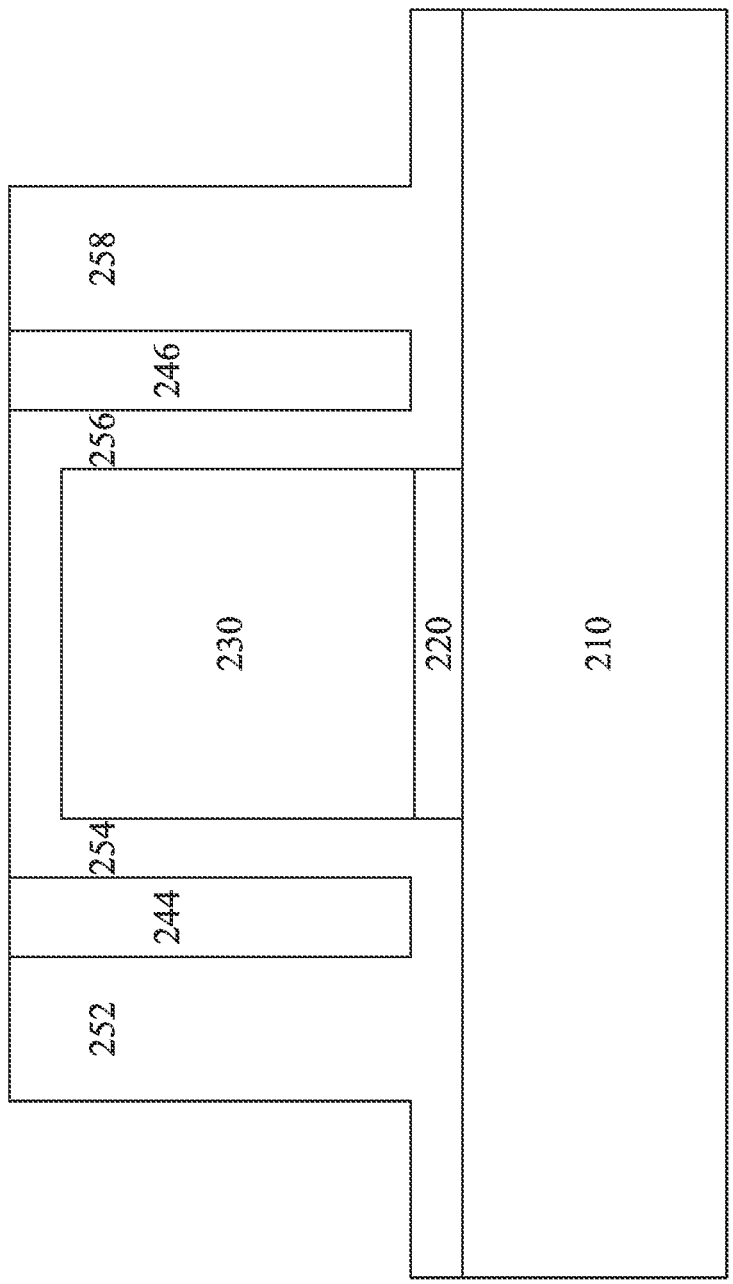

In a step 296, the second oxide layer is etched (FIG. 2H). Step 296 can include shaping the second oxide layer as illustrated in FIG. 2H such that two vertical portions of the second oxide layer remain. As shown, the top surface of these vertical portions are flush or approximately flush with the top surfaces of the etched first nitride layer and the top surface of the first oxide layer. As a result of the etching process performed in step 296, the thickness of the remaining vertical portions of the second oxide layer is 300 angstroms, in some embodiments. However, the thickness of these vertical portions may be thicker or thinner, such as ranging from about 250-350 angstroms in thickness. Thicknesses outside of this range are also contemplated depending on the application. In some embodiments, the etching process performed in step 296 is a dry etching process.

Figure 2I:
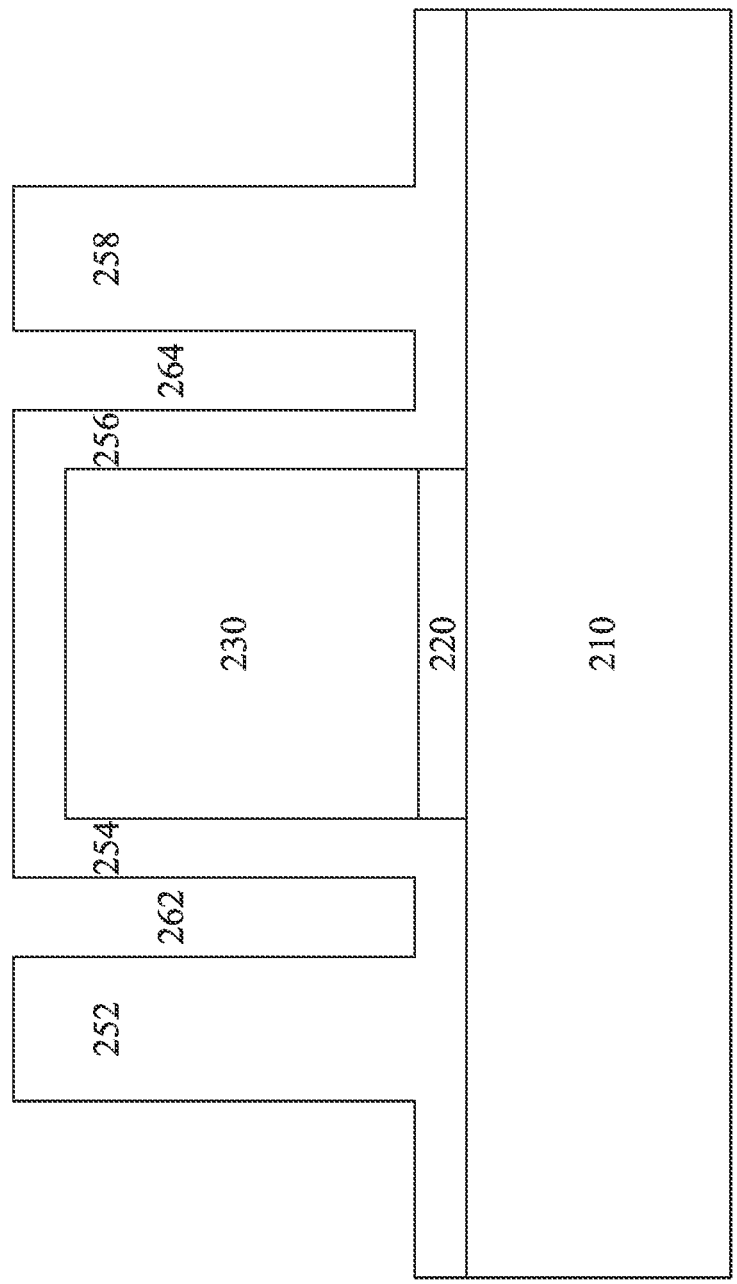

In a step 297, the first nitride layer is etched to form voids (FIG. 2I). Step 297 can include forming voids 262 and 264 within spacer layers 244 and 246, respectively. In some embodiments, the etching process performed in step 297 is a wet etching process. The etching process performed in step 297 may completely or partially remove the etched first nitride layer disposed between the first oxide layer and the etched second oxide layer in order to form void 262 and void 264. In some embodiments, the cross-sectional area of void 262 ranges from 5% to 80% of the cross-sectional area of spacer layer 244 and the cross-sectional area of void 264 ranges from 5% to 80% of the cross-sectional area of spacer layer 246, however cross-sectional areas outside of this range are also contemplated depending on the application. In some embodiments, the vertical height of void 262 ranges from 10% to 80% of the height of spacer layer 244 and the vertical height of void 264 ranges from 10% to 80% of the height of spacer layer 246, however heights outside of this range are also contemplated depending on the application. Both void 262 and void 264 can be either completely or partially surrounded by spacer layer 244 and spacer layer 246, respectively. Both void 262 and void 264 are filled with air to prevent charge leakage and provide better memory retention for semiconductor device 200.

Figure 2J:
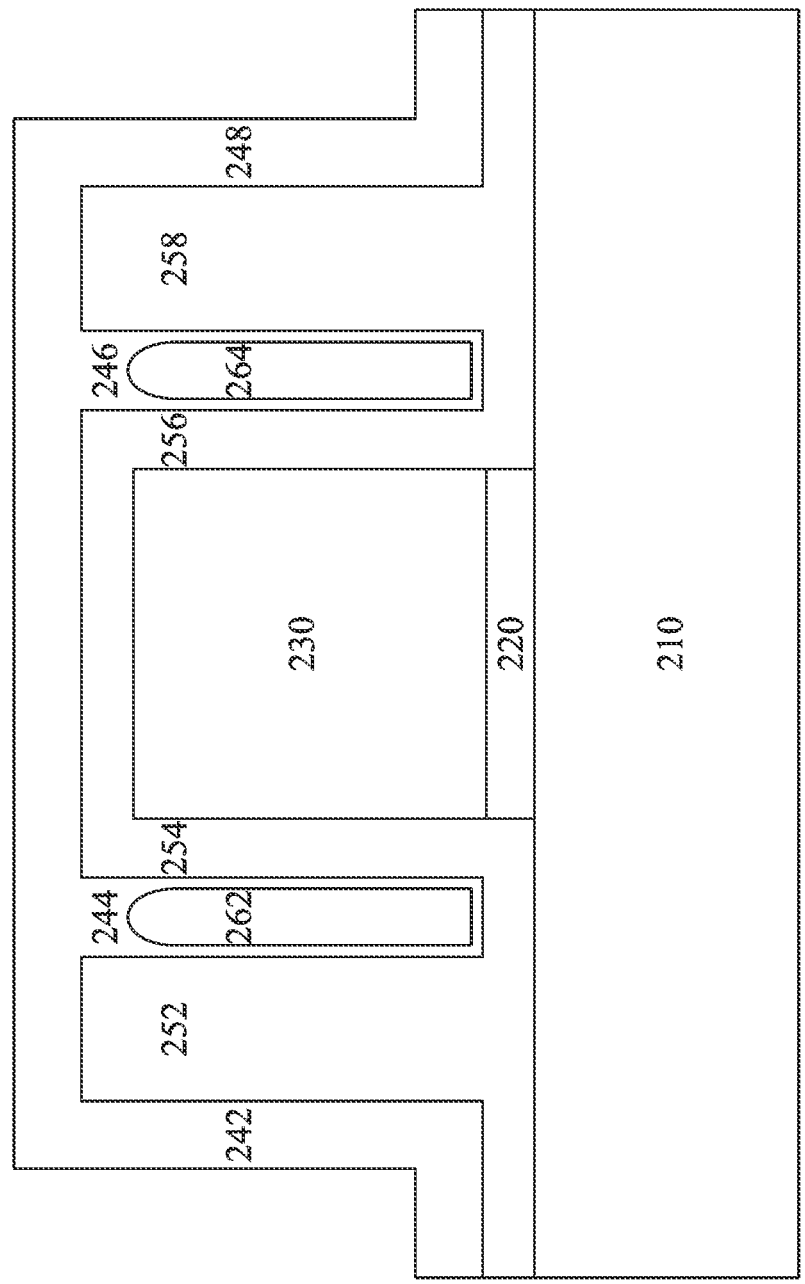

In a step 298, a second nitride layer is deposited over the first oxide layer, the etched second oxide layer, and the now twice-etched first nitride layer with the voids formed therein (FIG. 2J). Step 298 can include depositing the nitride layer that forms spacer layers 242 and 248. In some embodiments, the second nitride layer deposited in step 298 has a thickness of 150 angstroms. However, the second nitride layer may be slightly thicker or thinner, such as ranging from about 100-200 angstroms. Thicknesses outside of this range are also contemplated depending on the application. Like the first nitride layer, the second nitride layer can be formed of silicon nitride or another similar nitride material. As illustrated in FIG. 2J, the second nitride layer is deposited over the first oxide layer, the etched second oxide layer, and the now twice-etched first nitride layer with void 262 and void 264 formed therein. Step 298 generally completes the formation of voids within the overall spacer structure.

Figure 2K:
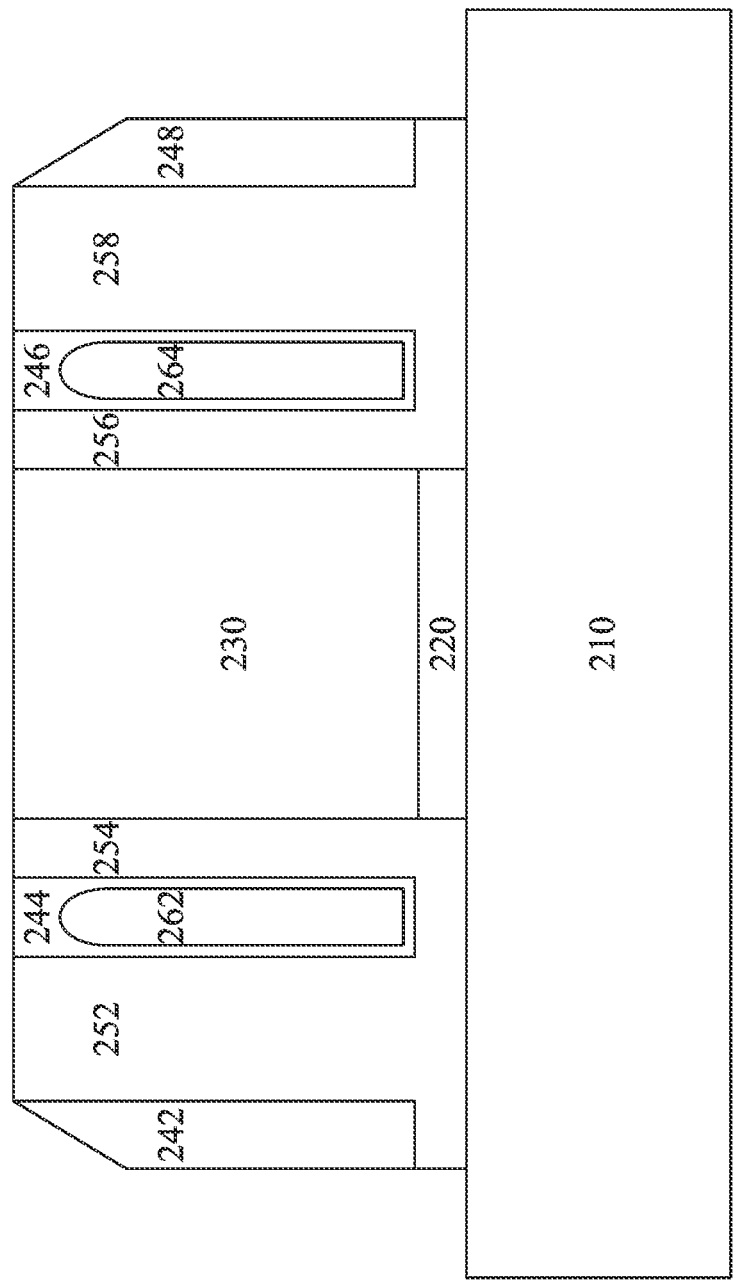

In a step 299, the second nitride layer is etched (FIG. 2K). Step 299 can include shaping the second nitride layer, the first oxide layer, the second oxide layer, and the first nitride layer to form spacer layers 242, 252, 244, 254, 256, 246, 258, and 248. As illustrated in FIG. 2K, step 299 includes shortening the height of each of these layers such that the top surfaces of each of these layers are flush or approximately flush relative to each other. Also shown in FIG. 2K, step 299 includes removing horizontal portions of the second nitride layer to form two vertical portions that become spacer layers 242 and 248. Moreover, spacer layers 242 and 248 are shaped with an angled top surface that slopes downwards and away from gate 230.

Figure 3A:
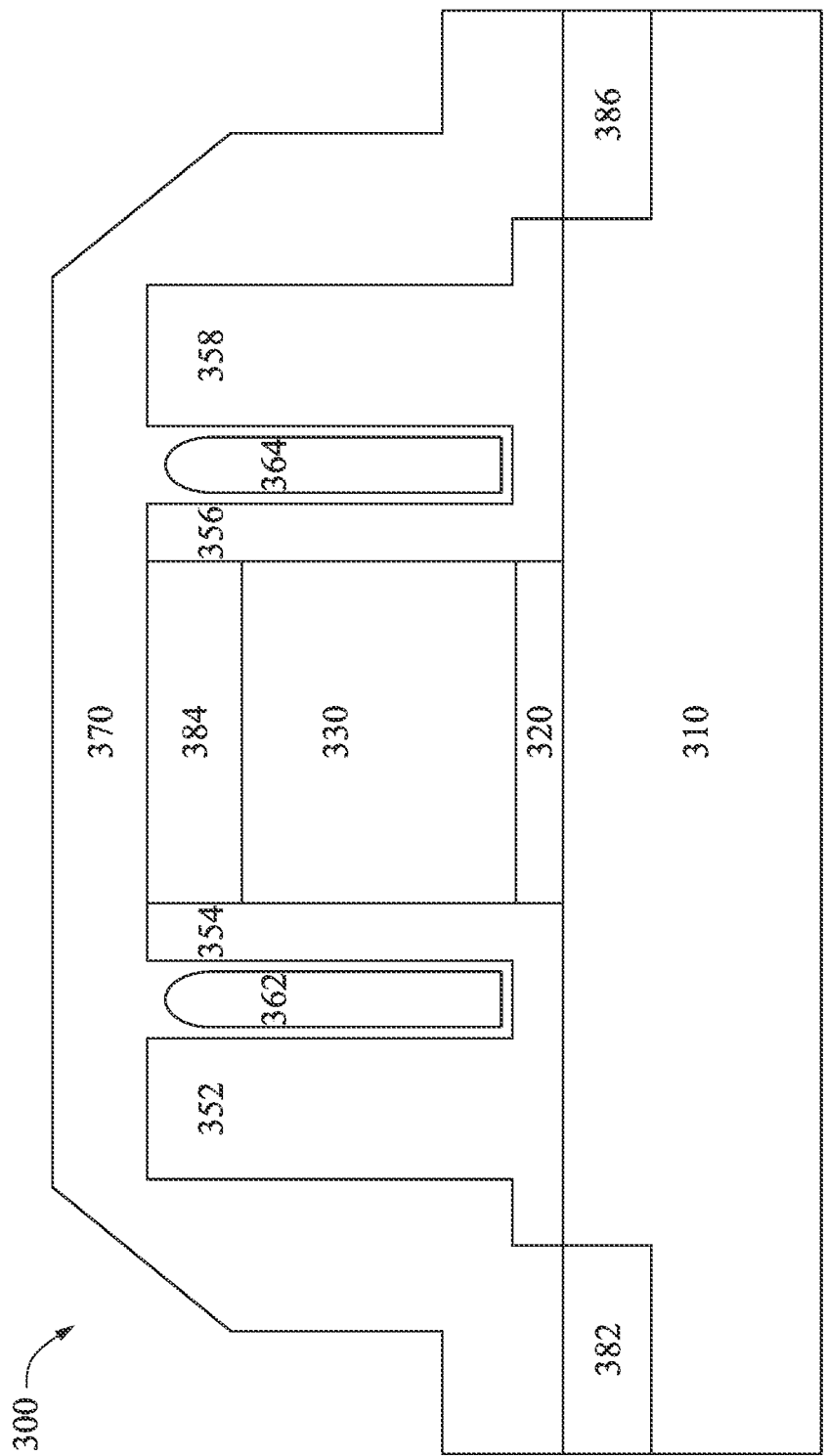
FIG. 3A is a drawing showing a cross-sectional view of another example semiconductor device having a spacer with an air-void, in accordance with some embodiments.

Referring now to FIGS. 3A-3K, an example semiconductor device 300 and an example process 390 for fabricating semiconductor device 300 are shown, in accordance with some embodiments. Semiconductor device 300 is also similar to semiconductor device 100 in many aspects. Referring specifically to FIG. 3A, a semiconductor device 300 is shown to include a substrate 310, a gate oxide layer 320, and a gate 330. These structures are similar to substrate 110, gate oxide layer 120, and gate 130 described above. Semiconductor device 300 is also shown to have a spacer structure including, to the left of gate 330, a spacer layer 354, a void 362, and a spacer layer 352 and, to the right of gate 330, a spacer layer 356, a void 364, and a spacer layer 358. Spacer layers 352, 354, 356, and 358 are oxide layers, such as formed of silicon oxide material. Void 362 and void 364 are filled with air. These structures are similar to spacer layers 152, 154, 156, and 158 and voids 162 and 164 described above.

However, also shown in FIG. 3A is a contact etch stop layer (CESL) 370 as well as electrodes 382, 384, and 386. In semiconductor device 300, CESL 370 essentially replaces spacer layers 142, 144, 146, and 148 of semiconductor device 100. CESL 370 can be formed of materials such as silicon nitride, silicon oxide and silicon nitride, silicon nitride and/or silicon carbide, and other suitable materials and combinations thereof. Electrodes 382, 384, and 386 can be formed of nickel silicide or other suitable materials or combination of suitable materials. In some embodiments, electrode 382 provides a conductive terminal for the source region of semiconductor device 300, electrode 384 provides a conductive terminal for gate 330, and electrode 386 provides a conductive terminal for the drain region of semiconductor device 300. As discussed in further detail below, unlike process 290, in process 390 the formation of voids 362 and 364 is completed as a result of depositing CESL 370, and not by depositing the second nitride layer as in process 290. Moreover, in process 390, formation of voids 362 and 364 occurs after the formation of electrodes 382, 384, and 386, as discussed in more detail below.

Figure 3B:
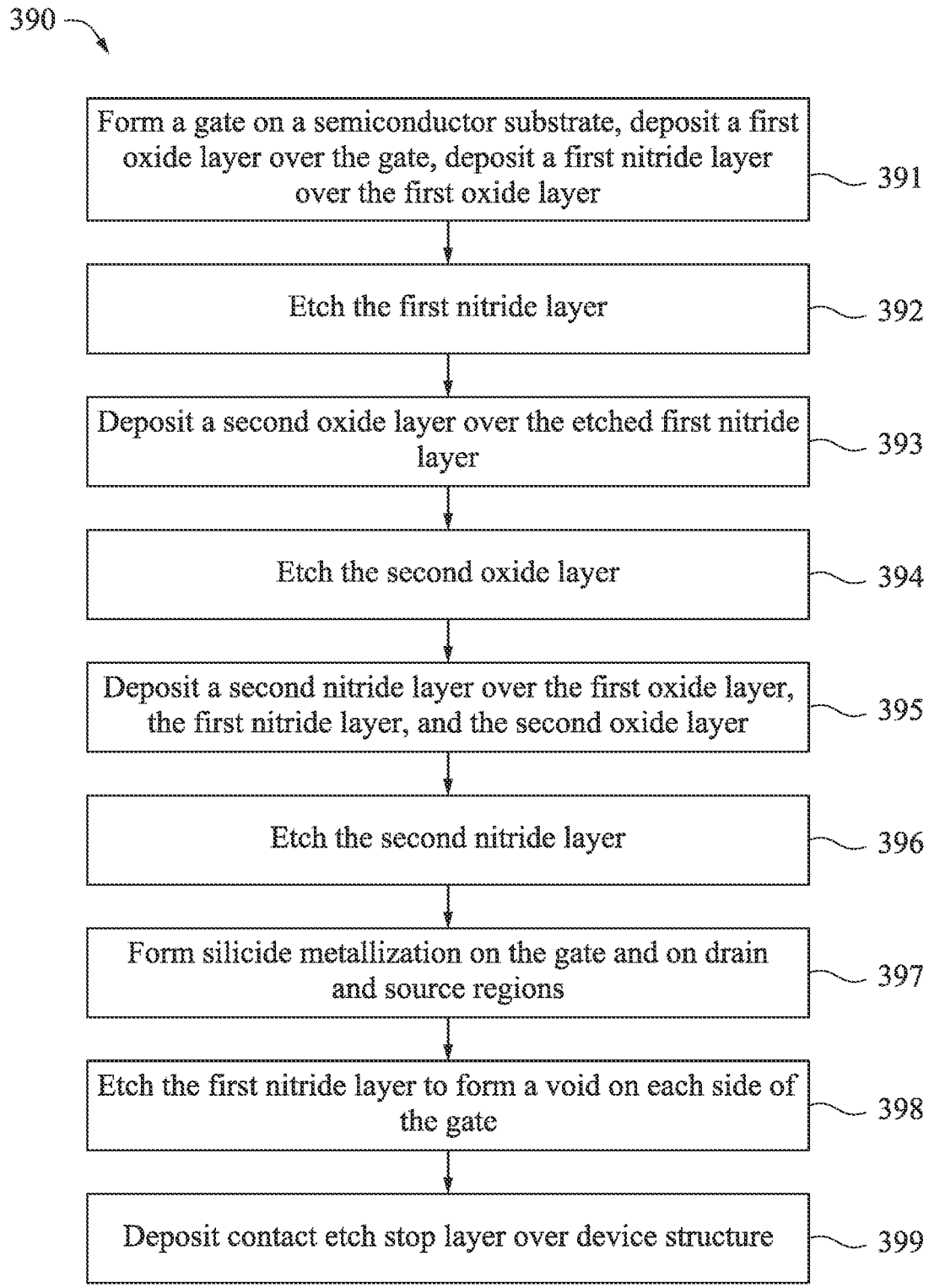
FIG. 3B is a flowchart showing a process for fabricating the example semiconductor device of FIG. 3A, in accordance with some embodiments.

Referring specifically to FIG. 3B, a flowchart illustrating the steps of process 390 is shown. Referring specifically to FIGS. 3C-3K, various drawings illustrating the steps of process 390 are shown. Process 390 provides a method for forming voids in a spacer after formation of the spacer itself and after metallization of the source, gate, and drain regions of the semiconductor device. Process 390 provides an example of another possible process for producing a semiconductor device with air-voids in a spacer structure. Another example structure that can be formed using a similar process is provided below with respect to FIG. 4.

Figure 3C:
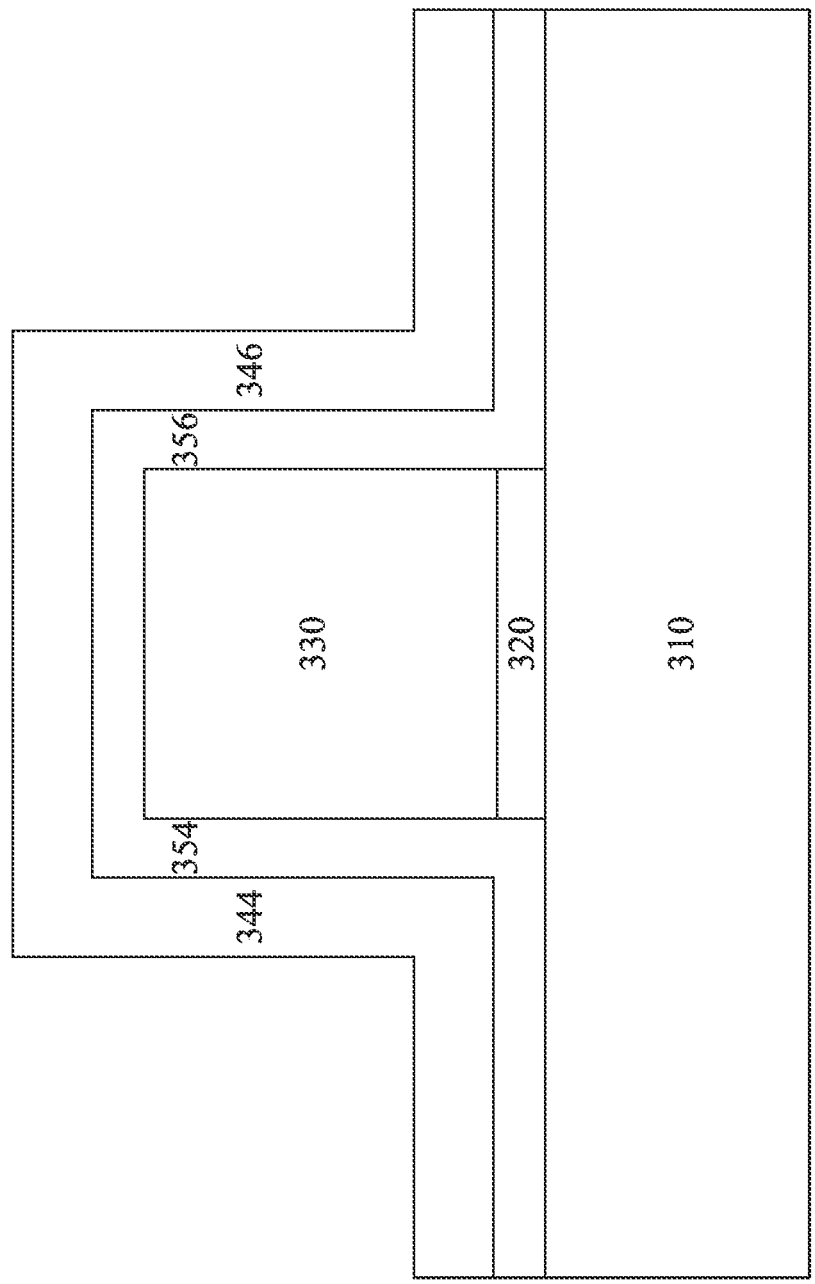
FIGS. 3C-3K are a series of drawings showing the steps in the process of FIG. 3B, in accordance with some embodiments.

In a step 391, a gate is formed on a semiconductor substrate, a first oxide layer is deposited over the gate and over the substrate, and a first nitride layer is deposited over the first oxide layer (FIG. 3C). Step 391 is similar to 291, 292, and 293 of process 290. Step 391 can include forming gate oxide layer 320 on substrate 310, forming gate 330 on gate oxide layer 320, depositing the oxide layer that forms spacer layers 354 and 356 over gate 330 and over substrate 310, and depositing a nitride layer (ultimately forming layers 344 and 346 on opposing sides of gate 330) over the oxide layer similar to the nitride layer deposited in step 293 of process 290. In some embodiments, the first oxide layer deposited in step 391 has a thickness of 80 angstroms. However, the first oxide layer can be slightly thicker or thinner, such as ranging from about 65 to 95 angstroms in thickness. Thicknesses outside of this range are also contemplated depending on the application. The first oxide layer can be formed of silicon oxide or another similar oxide material. As noted above, silicon oxide has a dielectric constant of about 3.9. As illustrated in FIG. 3C, the first oxide layer is deposited over gate 330 and over substrate 310. In some embodiments, the first nitride layer deposited in step 391 has a thickness of 150 angstroms. However, the first nitride layer can be slightly thicker or thinner, such as ranging from about 120-180 angstroms in thickness. Thicknesses outside of this range are also contemplated depending on the application. The first nitride layer can be formed of silicon nitride or another similar material. As noted above, silicon nitride has a dielectric constant of about 7.5, which is higher than the dielectric constant of silicon oxide. As illustrated in FIG. 3C, the first nitride layer is deposited over the first oxide layer.

Figure 3D:
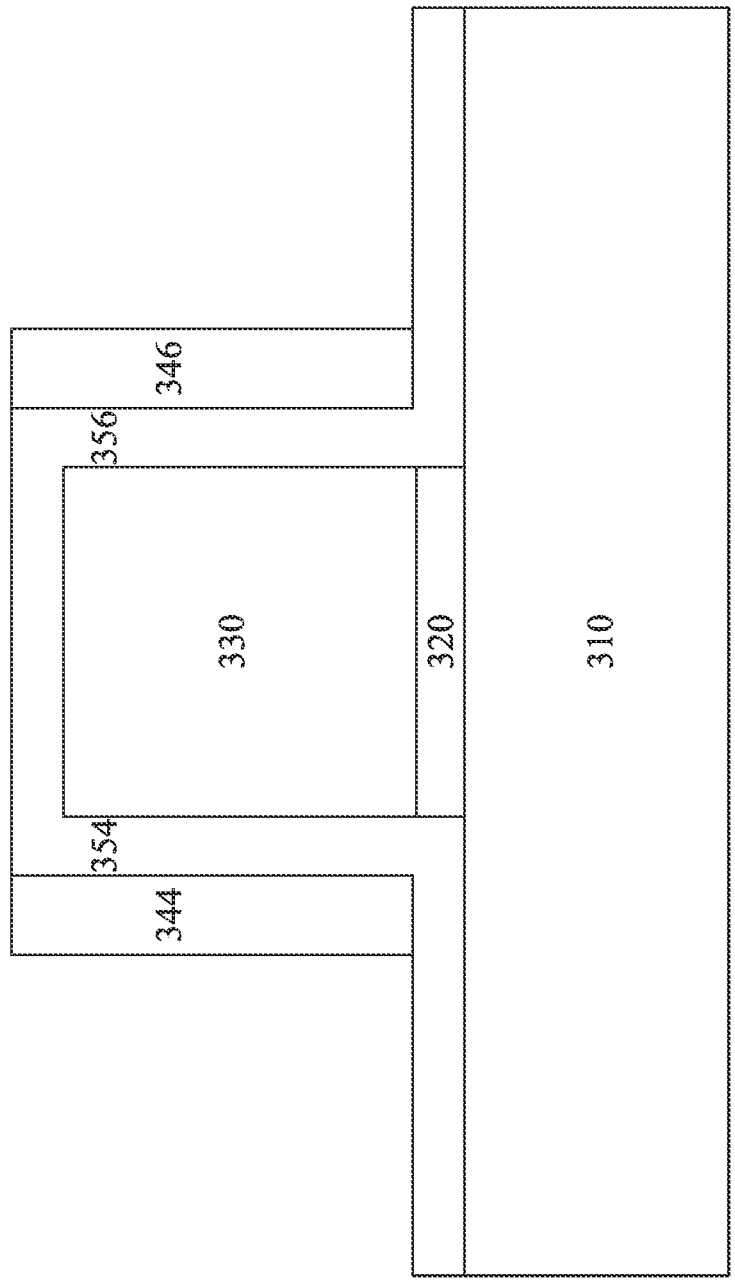

In a step 392, the first nitride layer is etched (FIG. 3D). Step 392 is similar to step 294 of process 290. Step 392 can include shaping the first nitride layer as illustrated in FIG. 3D such that two vertical portions of the first nitride layer remain. As shown, the top surface of vertical portions are flush or approximately flush with the top surface of the first oxide layer. As a result of the etching process performed in step 392, the thickness of the remaining vertical portions of the first nitride layer is about 120 angstroms, in some embodiments. However, the thickness of these vertical portions may be thicker or thinner, such as ranging from about 100-140 angstroms in thickness. Thicknesses outside of this range are also contemplated depending on the application. In some embodiments, the etching process performed in step 392 is a dry etching process.

Figure 3E:
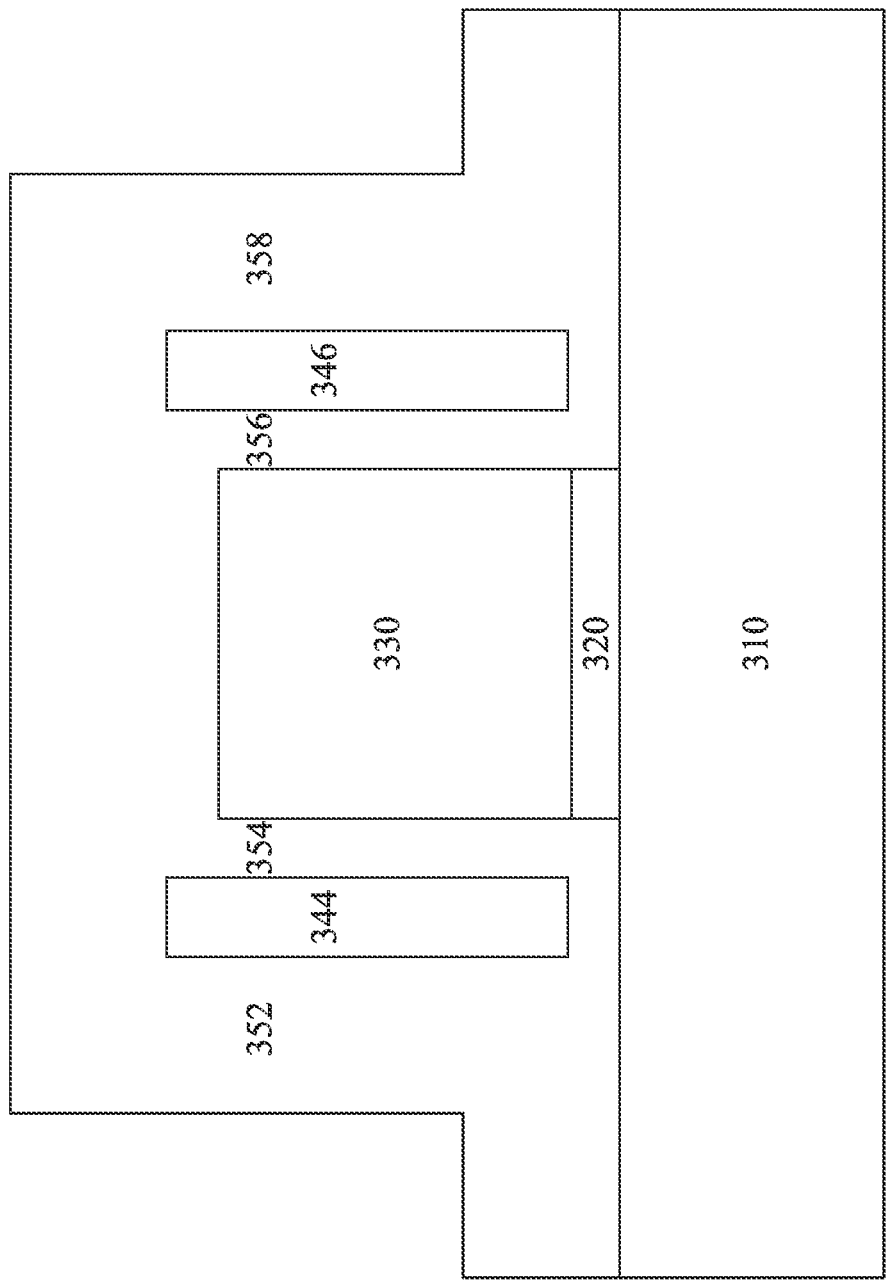

In a step 393, a second oxide layer is deposited over the etched first layer of silicon nitride and the first oxide layer (FIG. 3E). Step 393 is similar to step 295 of process 290. Step 393 can include depositing the oxide layer that forms spacer layers 352 and 358. In some embodiments, the second oxide layer deposited in step 393 has a thickness of 500 angstroms. However, the second oxide layer may be slightly thicker or thinner, such as ranging from about 300-700 angstroms. Thicknesses outside of this range are also contemplated depending on the application. Like the first oxide layer, the second oxide layer can be formed of silicon oxide or another similar oxide material. As illustrated, the second oxide layer is deposited over the first oxide layer and the etched first nitride layer.

Figure 3F:
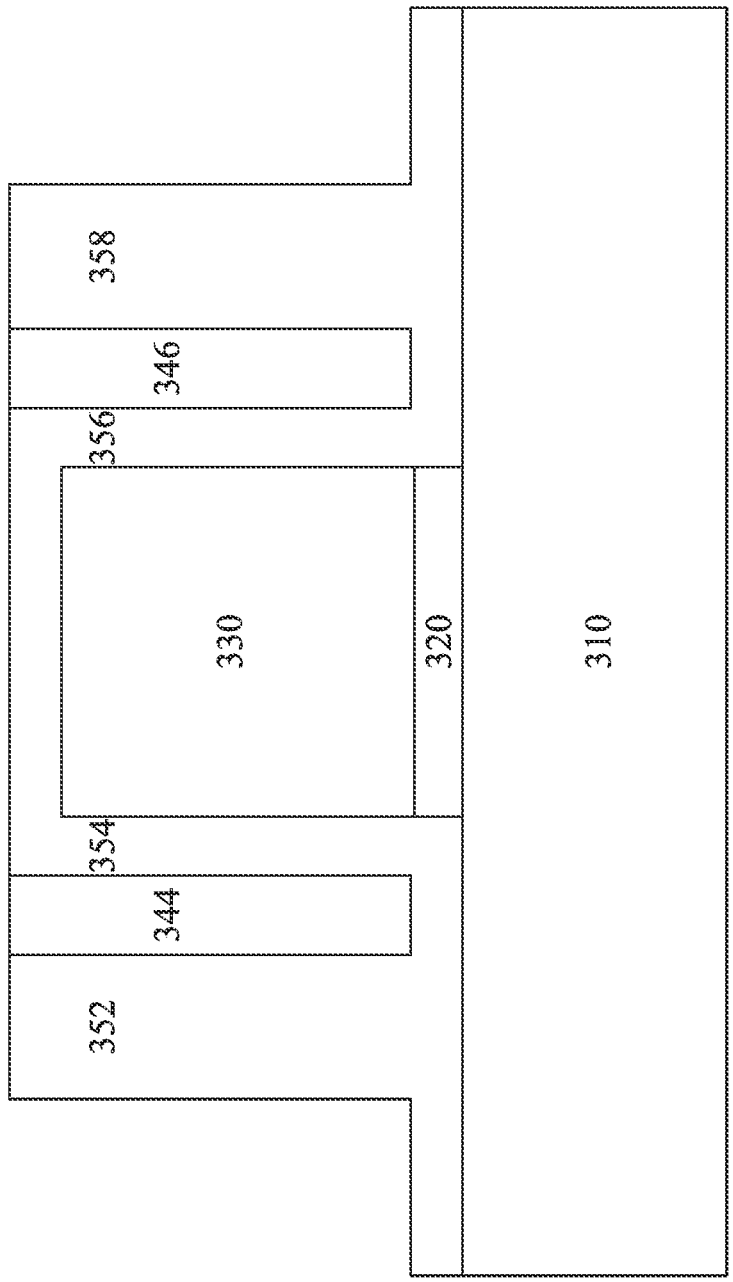

In a step 394, the second oxide layer is etched (FIG. 3F). Step 394 is similar to step 296 of process 290. Step 394 can include shaping the second oxide layer as illustrated such that two vertical portions of the second oxide layer remain. As shown, the top surface of these vertical portions are flush or approximately flush with the top surfaces of the etched first nitride layer and the top surface of the first oxide layer. As a result of the etching process performed in step 394, the thickness of the remaining vertical portions of the second oxide layer is 300 angstroms, in some embodiments. However, the thickness of these vertical portions may be thicker or thinner, such as ranging from about 250-350 angstroms in thickness. Thicknesses outside of this range are also contemplated depending on the application. In some embodiments, the etching process performed in step 394 is a dry etching process.

Figure 3G:
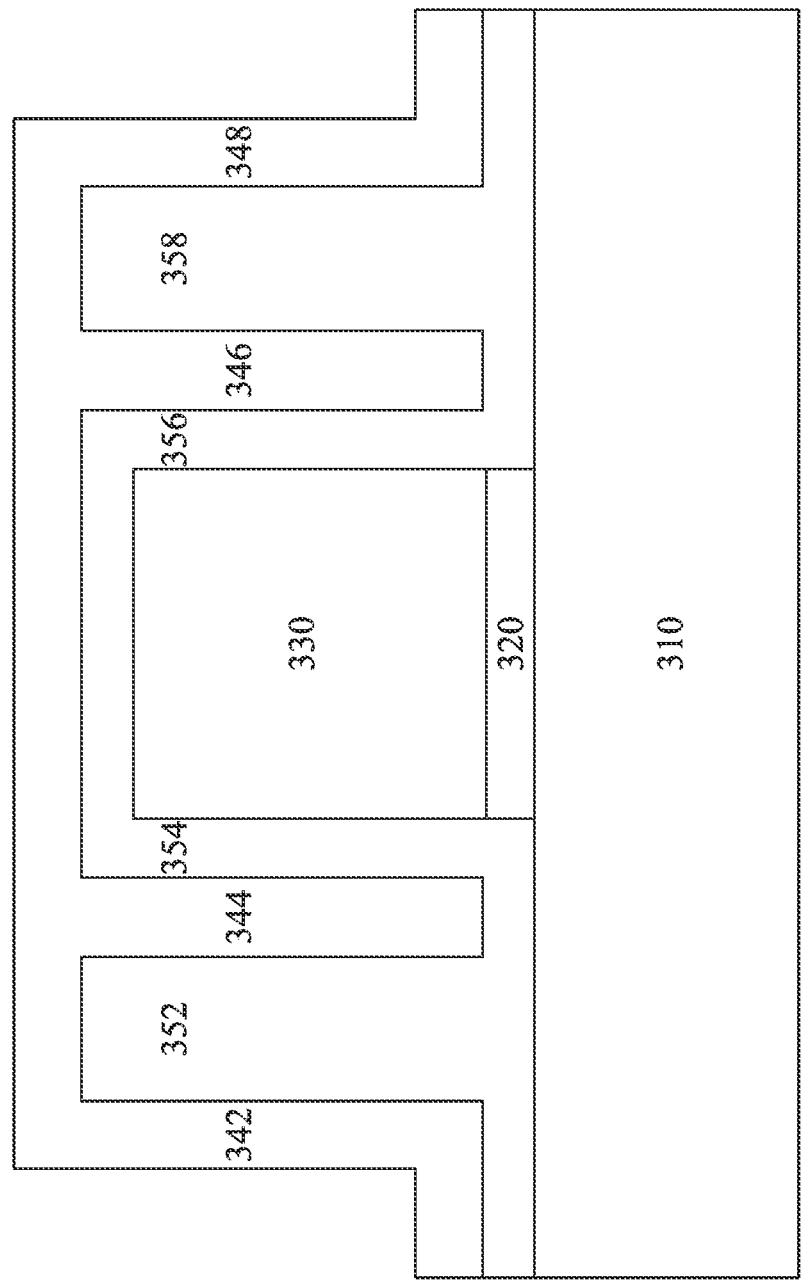

In a step 395, a second nitride layer is deposited over the first oxide layer, the etched first nitride layer, and the etched second oxide layer (FIG. 3G). Notably, unlike process 290, the second nitride layer is deposited before the first nitride layer is etched to form voids. Accordingly, also unlike process 290, depositing the second nitride layer does not generally complete the formation of voids. In some embodiments, the second nitride layer deposited in step 395 has a thickness of 150 angstroms. However, the second nitride layer deposited in step 395 may be slightly thicker or thinner, such as ranging from about 100-150 angstroms, and thicknesses outside of this range are also contemplated depending on the application. Like the first nitride layer, the second nitride layer can be formed of silicon nitride or another similar nitride material. As illustrated in FIG. 3G, the second nitride layer is deposited over the first oxide layer, the etched second oxide layer, and the etched first nitride layer.

Figure 3H:
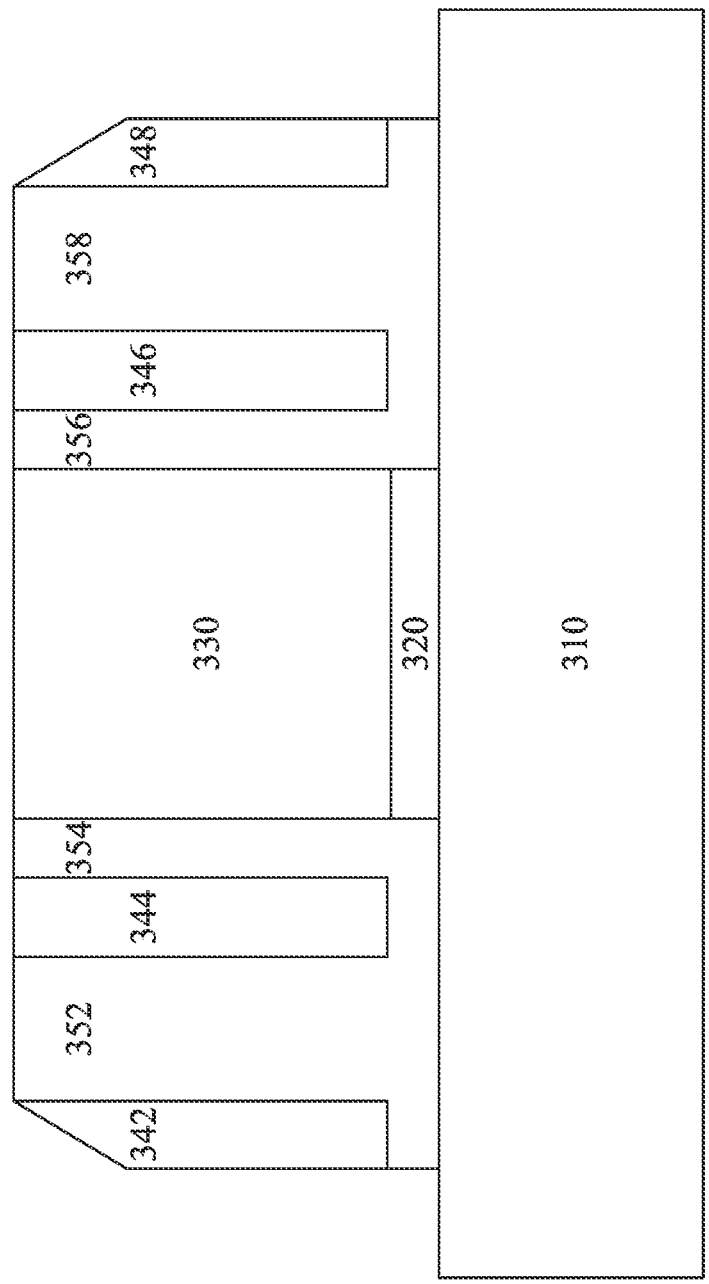

In a step 396, the second nitride layer and the first oxide layer are etched (FIG. 3H). Step 396 can include shaping the second nitride layer, the first oxide layer, the second oxide layer, and the first nitride layer to form spacer layers 342, 352, 344, 354, 356, 346, 358, and 348. As illustrated, step 396 includes shortening the height of each of these layers such that the top surfaces of each of these layers are flush or approximately flush relative to each other. Also shown in FIG. 3H, step 396 includes removing horizontal portions of the second nitride layer to form spacer layers 342 and 348. Moreover, each of spacer layers 342 and 348 are shaped with an angled top surface that slopes downwards and away from gate 330.

Figure 3I:
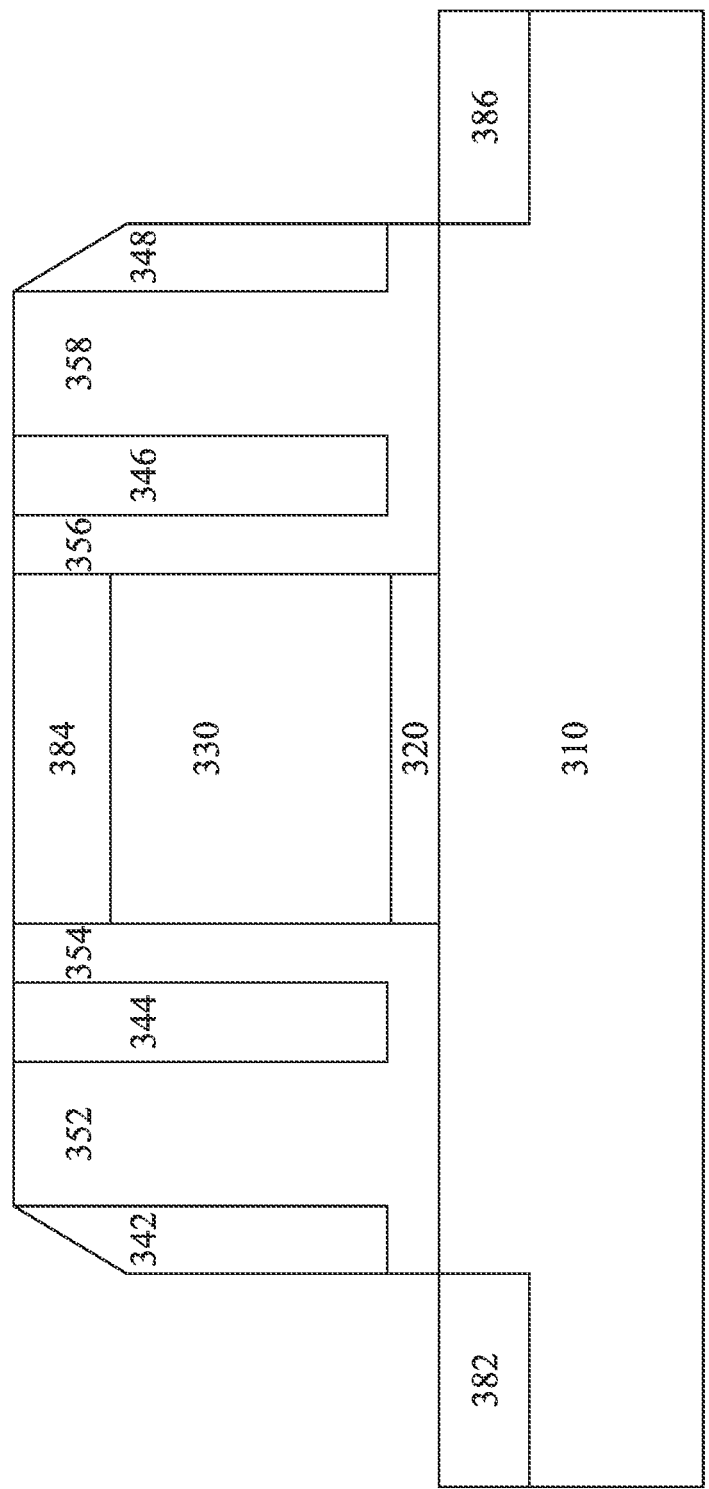

In a step 397, silicide metallization is formed on the gate and on the source and drain regions of the substrate (FIG. 3I). Step 397 can include formation of electrodes 382, 384, and 386 described above. The source and drain regions can be formed within substrate 310 using processes such as implantation, deposition, doping, heat treatment, and other suitable processes and combinations thereof. A salicidation process can then be performed to from conductive terminals over these regions and over the gate. Notably, step 397 occurs before voids are formed within the spacer structure.

Figure 3J:
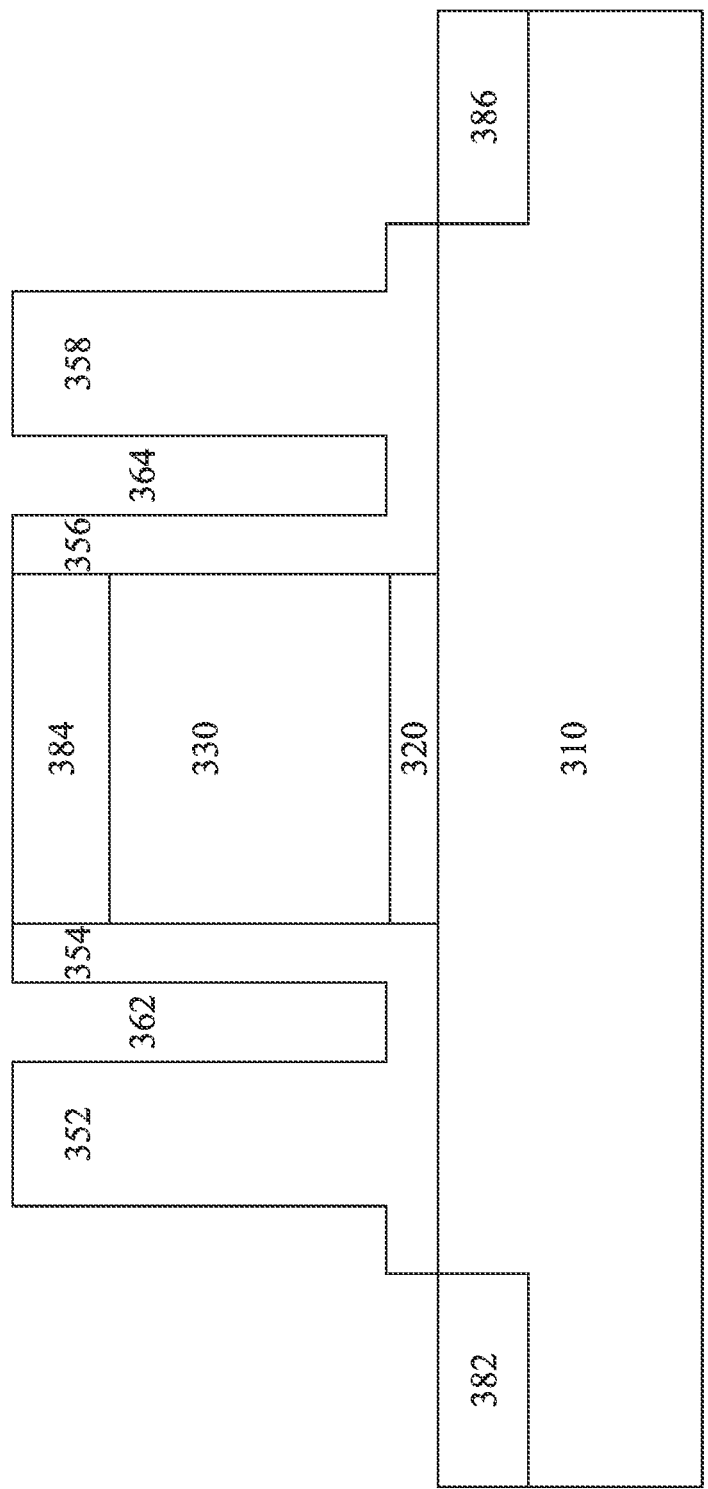

In a step 398, the first nitride layer is etched to form voids (FIG. 3J). Step 398 is similar to step 297 of process 290. Step 398 includes forming voids 362 and 364. In some embodiments, the etching process performed in step 398 is a wet etching process. The etching process performed in step 398 may completely or partially remove spacer layers 344 and 346 in order to form voids 362 and 364. In some embodiments, the cross-sectional area of void 362 ranges from 5% to 80% of the cross-sectional area of spacer layer 344 and the cross-sectional area of void 364 ranges from 5% to 80% of the cross-sectional area of spacer layer 346, however cross-sectional areas outside of this range are also contemplated depending on the application. In some embodiments, the vertical height of void 362 ranges from 10% to 80% of the height of spacer layer 344 and the vertical height of void 364 ranges from 10% to 80% of the height of spacer layer 346, however heights outside of this range are also contemplated depending on the application. Both void 362 and void 364 can be either completely or partially surrounded by spacer layer 344 and CESL 370 and spacer layer 346 and CESL 370, respectively. Voids 362 and 364 are filled with air to prevent charge leakage and provide better memory retention for semiconductor device 300.

Figure 3K:
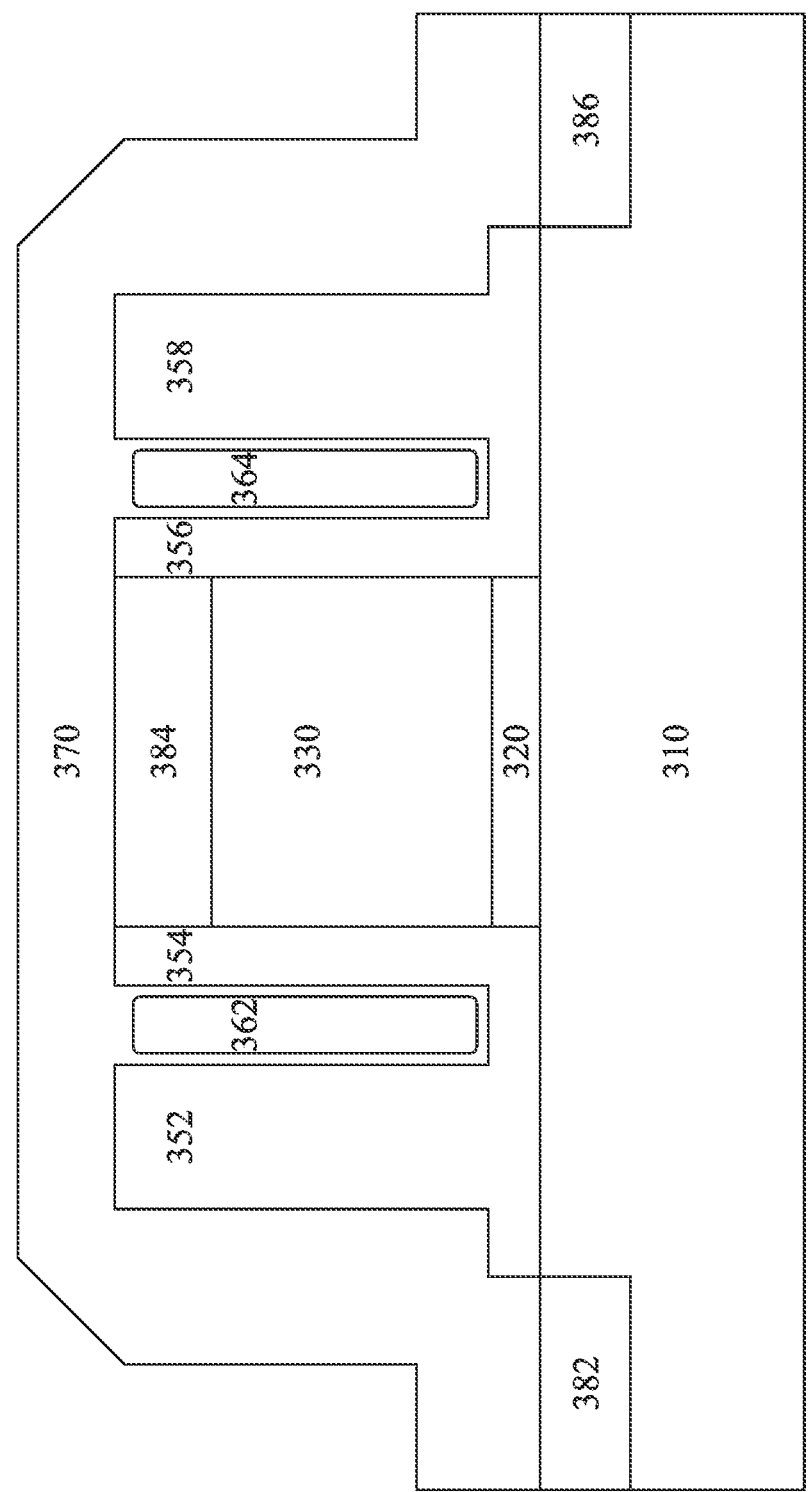

In a step 399, a contact etch stop layer is deposited over the device structure (FIG. 3K). Step 399 can include depositing CESL 370 discussed above. After step 399 is performed, the formation of voids 362 and 364 is generally complete. In some embodiments, when all of the nitride material used to form the first nitride layer and the second nitride layer is removed in step 398, the CESL material may fill in the gaps around the voids formed in step 398 such that the voids are completely surrounded by the CESL material. In other embodiments, some of the nitride material remains after completion of step 398, and the CESL fills in over the remaining nitride material such that the voids are completely surrounded by the remaining nitride material. In further embodiments, after step 399, the voids are surrounded by a combination of nitride and CESL material.

Figure 4:
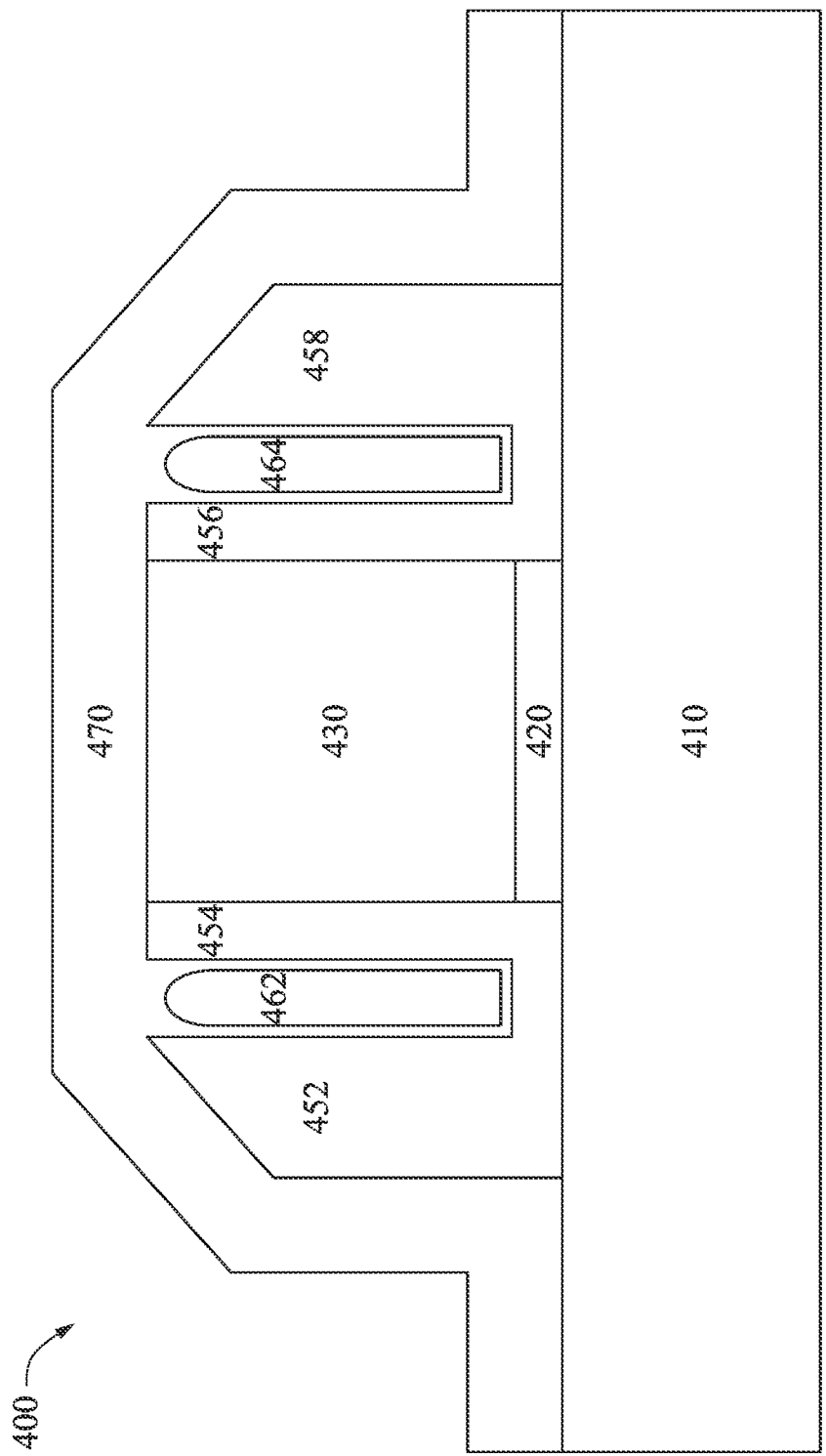
FIG. 4 is a drawing showing a cross-sectional view of another example semiconductor device having a spacer with an air-void, in accordance with some embodiments.

Referring now to FIG. 4, another example semiconductor device 400 having a spacer with air-voids is shown, in accordance with some embodiments. Semiconductor device 400 is similar to semiconductor device 100. For example, semiconductor device 400 is shown to include a substrate 410, a gate oxide layer 420, and a gate 430. These structures are similar to substrate 110, gate oxide layer 120, and gate 130 described above. Semiconductor device 400 is also shown to have a spacer structure including, to the left of gate 430, a spacer layer 454, a void 462, and a spacer layer 452 and, to the right of gate 430, a spacer layer 456, a void 464, and a spacer layer 458. Spacer layers 452, 454, 456, and 458 are oxide layers, such as formed of silicon oxide material. Void 462 and void 464 are filled with air. These structures are similar to spacer layers 152, 154, 156, and 158 and voids 162 and 164 described above.

Similar to semiconductor device 300, semiconductor device 400 is shown to include a contact etch stop layer (CESL) 470. Similar to CESL 370, CESL 470 essentially replaces spacer layers 142, 144, 146, and 148 of semiconductor device 100. CESL 470 can be formed of materials such as silicon nitride, silicon oxide and silicon nitride, silicon nitride and silicon carbide, and other suitable materials and combinations thereof. Unlike semiconductor device 300, however, semiconductor device 400 is not shown to include electrodes similar to electrodes 382, 384, and 386. It will be appreciated that electrodes such as electrodes 382, 384, and 386 can be formed after depositing of CESL 470 as suggested by FIG. 4. For example, process 390 may be altered such that steps 398 and 399 occur before step 397.

Figure 5:
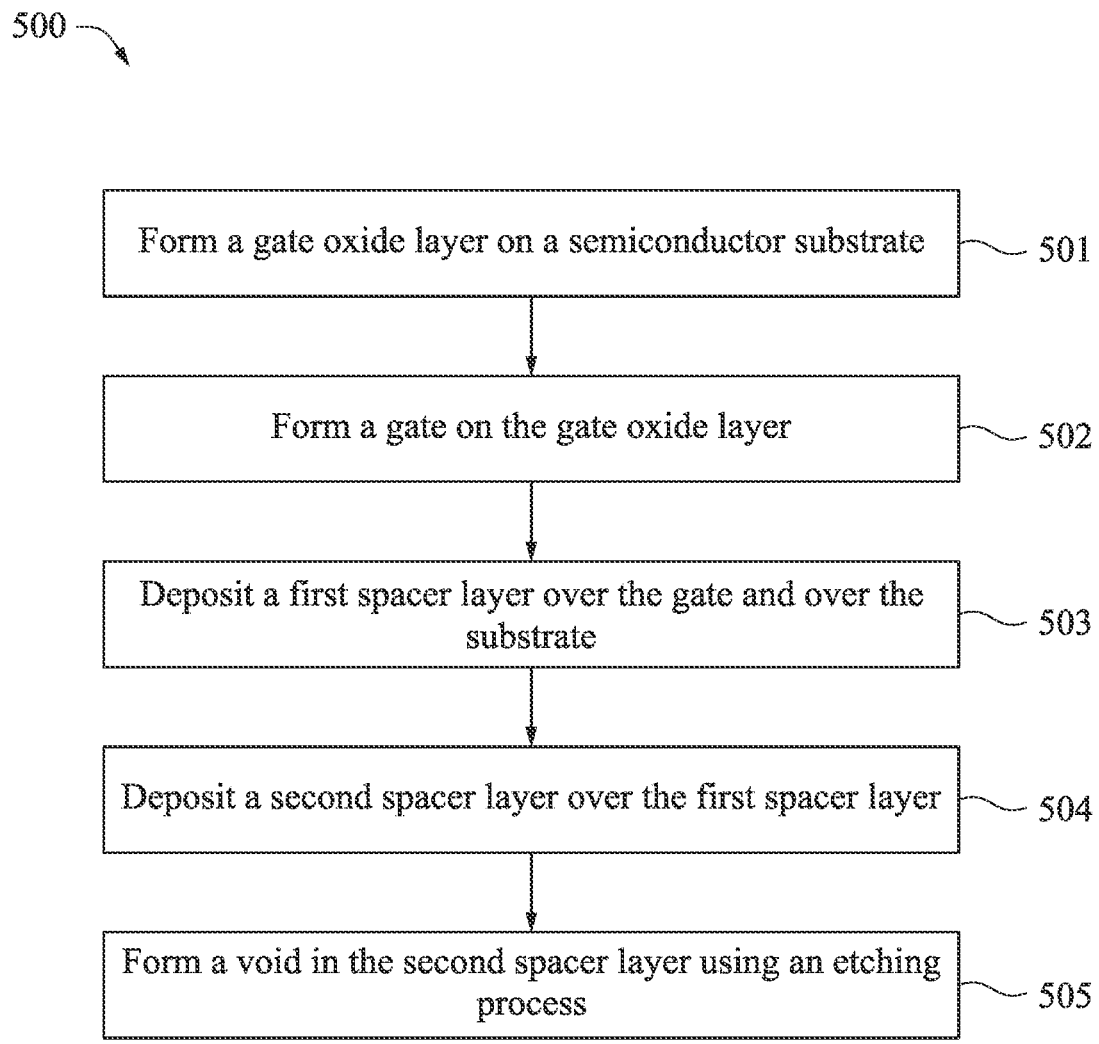
FIG. 5 is a flowchart showing a process for fabricating a semiconductor device having a spacer with an air-void, in accordance with some embodiments.

Referring now to FIG. 5, a flowchart illustrating an example process 500 for fabricating a semiconductor device having a spacer with an air-void is shown, according to some embodiments. Process 500 is similar to processes 290 and 390 described above, however process 500 provides a more generalized process flow that can be implemented to fabricate a semiconductor device having a spacer with an air-void.

In a step 501, a gate oxide layer is formed on a semiconductor substrate. For example, step 501 can include forming gate oxide layer 120 on substrate 110 of semiconductor device 100. In a step 502, a gate is formed on the gate oxide layer. For example, step 502 can include forming gate 130 on gate oxide layer 120. In a step 503, a first spacer layer is formed over the gate and over the substrate. For example, step 503 can include depositing the spacer layer that, when etched, forms spacer layers 154 and 156 on opposing sides of gate 130. In a step 504, a second spacer layer is formed over the first spacer layer. For example, step 504 can include depositing the spacer layer that, when etched, forms spacer layers 144 and 146 on opposing sides of gate 130.

In a step 505, a void is formed in the second spacer layer using an etching process. As discussed above, in some embodiments, the void is formed in the second spacer using a wet etching process. In the example described with respect to process 290, voids 262 and 264 are formed during formation of the spacer itself, and before any salicidation or depositing of CESL occurs. In the example described with respect to process 390, voids 362 and 364 are formed after salicidation occurs but before depositing of CESL 370 occurs. In the example described with respect to semiconductor device 400, voids 462 and 464 are formed before salicidation occurs and before depositing of CESL 470 occurs. As discussed above, third and fourth spacer layers (and possibly even more additional layers) may also be deposited when completing formation of the overall spacer structure. It will be appreciated that a variety of different processes are possible to fabricate a semiconductor device having a spacer with an air-void.

As described in detail above, the formation of a void filled with air in a spacer of a semiconductor device can provide improved data retention in memory devices such as MTP memory devices. Further, as discussed, different processes can be performed to fabricate such a semiconductor device. Because the void filled with air has a low dielectric constant relative to other materials that may be used to form a spacer, parasitic capacitances, fringing capacitances, and overlap capacitances can be reduced. These phenomena can result in reduced charge leakage and better data retention.

An implementation of the present disclosure is a semiconductor device. The semiconductor device includes a substrate, a gate oxide layer formed on the substrate, a gate formed on the gate oxide layer, and a spacer formed adjacent the gate and over the substrate. The spacer includes a void filled with air.

Another implementation of the present disclosure is a method of fabricating a semiconductor device. The method includes forming a gate oxide layer on a substrate, forming a gate on the gate oxide layer, depositing a first spacer layer adjacent the gate and over the substrate, depositing a second spacer layer over the first spacer layer, and forming a void filled with air within the second spacer layer using an etching process.

Yet another implementation of the present disclosure is an MTP memory device. The device includes a substrate, a gate oxide layer formed on the substrate, a gate formed on the gate oxide layer, and a spacer. The spacer includes an oxide layer formed adjacent the gate and over the substrate and a nitride layer in contact with the oxide layer comprising a void filled with air.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a gate disposed over the substrate with a gate oxide layer interposed between the substrate and the gate;
   a spacer disposed adjacent the gate and comprising:
      a first layer formed of a first dielectric material and disposed in direct contact with the gate;
      a second layer formed of the first dielectric material; and
      a third layer, formed of a second, different dielectric material, that is interposed between the first layer and the second layer,
   wherein the third layer has a void filled with air,
   wherein the first layer and second layer each comprise a portion extending below the third layer, and
   wherein a top surface of the gate is flush with respective top surfaces of the first to third layers of the spacer.

2. The semiconductor device of claim 1, wherein the first layer is formed over the substrate and in direct contact with the gate oxide layer.

3. The semiconductor device of claim 1, wherein the void is completely surrounded by the third layer.

4. The semiconductor device of claim 1, wherein the first dielectric material includes silicon nitride material, and the second dielectric material includes silicon oxide material.

5. The semiconductor device of claim 1, wherein the portion of the first layer extending below the third layer and the portion of the second layer extending below the third layer are connected to each other.

6. The semiconductor device of claim 1, wherein the top surface of the third layer has a dip.

7. The semiconductor device of claim 1, wherein a ratio of a height of the gate to a height of the first layer is greater than 0.95.

8. The semiconductor device of claim 1, wherein a thickness of each of the first and second layers measured in a direction parallel to a top surface of the substrate is between 10 and 150 angstroms.

9. The semiconductor device of claim 1, wherein a thickness of the third layer measured in a direction parallel to a top surface of the substrate is between 50 and 300 angstroms.

10. The semiconductor device of claim 1, wherein the void filled with air is configured to provide an extended memory retention for a multiple-time programmable (MTP) memory device.

11. A semiconductor device comprising:
    a substrate;
    a gate disposed over the substrate with a gate oxide layer interposed between the substrate and the gate; and
    a spacer disposed adjacent the gate and comprising:
       a first oxide layer in direct contact with at least the gate;
       a nitride layer disposed adjacent the first oxide layer; and
       a second oxide layer disposed adjacent the nitride layer,
    wherein the nitride layer has a void filled with air, and
    wherein a top surface of the gate is flush with respective top surfaces of the first and second oxide layers and the nitride layer of the spacer.

12. The semiconductor device of claim 11, wherein the first oxide layer is interposed between the gate and the nitride layer, and the nitride layer is interposed between the first and second oxide layers.

13. The semiconductor device of claim 11, wherein the first oxide layer is also in direct contact with the gate oxide layer.

14. The semiconductor device of claim 11, wherein the first oxide layer comprises a first portion below the nitride layer and the second layer comprises a second portion below the nitride layer, and wherein the first portion and second portion are connected to each other.

15. The semiconductor device of claim 11, wherein the top surface of the nitride layer has a dip.

16. The semiconductor device of claim 11, wherein the void is completely surrounded by the nitride layer.

17. The semiconductor device of claim 11, wherein a thickness of each of the first and second oxide layers measured in a direction parallel to a top surface of the substrate is between 10 and 150 angstroms, and a thickness of the nitride layer measured in the direction parallel to the top surface of the substrate is between 50 and 300 angstroms.

18. A semiconductor device comprising:
    a substrate;
    a gate disposed over the substrate with a gate oxide layer interposed between the substrate and the gate; and
    a spacer disposed adjacent the gate and comprising:
       a first oxide layer in direct contact with at least the gate;
       a nitride layer disposed adjacent the first oxide layer; and
       a second oxide layer disposed adjacent the nitride layer,
    wherein the nitride layer has a void filled with air],
    wherein the first oxide layer comprises a first portion below the nitride layer and the second layer comprises a second portion below the nitride layer, the first portion and second portion being connected to each other, and
    wherein a top surface of the gate is flush with respective top surfaces of the first and second oxide layers and the nitride layer of the spacer.

19. The semiconductor device of claim 18, wherein the top surface of the nitride layer has a dip.

20. The semiconductor device of claim 18, wherein the first oxide layer is also in direct contact with the gate oxide layer.

* * * * *